(12) United States Patent
Kim et al.

(10) Patent No.: US 11,915,770 B2
(45) Date of Patent: Feb. 27, 2024

(54) METHOD OF REDUCING RELIABILITY DEGRADATION OF NONVOLATILE MEMORY DEVICE, NONVOLATILE MEMORY DEVICE USING THE SAME AND METHOD OF TESTING NONVOLATILE MEMORY DEVICE USING THE SAME

(71) Applicant: Samsung Electronics Co., Ltd., Suwon-si (KR)

(72) Inventors: Minseok Kim, Hwaseong-si (KR); Junyong Park, Seoul (KR); Doohyun Kim, Hwaseong-si (KR); Ilhan Park, Suwon-si (KR)

(73) Assignee: Samsung Electronics Co., Ltd., Gyeonoggi-do (KR)

( * ) Notice: Subject to any disclaimer, the term of this patent is extended or adjusted under 35 U.S.C. 154(b) by 92 days.

(21) Appl. No.: 17/736,395

(22) Filed: May 4, 2022

(65) Prior Publication Data
US 2023/0072218 A1 Mar. 9, 2023

(30) Foreign Application Priority Data

Sep. 6, 2021 (KR) .......................... 10-2021-0118285

(51) Int. Cl.
*G11C 16/34* (2006.01)
*G11C 11/56* (2006.01)
(Continued)

(52) U.S. Cl.
CPC ...... *G11C 16/3495* (2013.01); *G11C 11/5628* (2013.01); *G11C 11/5635* (2013.01);
(Continued)

(58) Field of Classification Search
CPC ............ G11C 16/3495; G11C 11/5628; G11C 11/5635; G11C 11/5671; G11C 16/0483;
(Continued)

(56) References Cited

U.S. PATENT DOCUMENTS 7,058,865 B2   6/2006 Mori et al.
7,545,679 B1 * 6/2009 Eguchi .................. G11C 29/50
                                                                365/185.09

(Continued)

*Primary Examiner* — Fernando Hidalgo
(74) *Attorney, Agent, or Firm* — Harness, Dickey & Pierce, P.L.C.

(57) ABSTRACT

In a method of reducing reliability degradation of a nonvolatile memory device, the nonvolatile memory device in which initial data having an initial threshold voltage distribution is stored in a plurality of memory cells connected to a plurality of wordlines is provided. Before a first process causing reliability degradation is performed, a first write operation is performed such that first data having a first threshold voltage distribution is stored into memory cells connected to first wordlines. The first wordlines have a degree of reliability degradation less than a reference value. Before the first process is performed, a second write operation is performed such that second data having a second threshold voltage distribution is stored into memory cells connected to second wordlines. The second wordlines have a degree of reliability degradation greater than or equal to the reference value.

20 Claims, 26 Drawing Sheets

(51) Int. Cl.
  *G11C 16/04* (2006.01)
  *G11C 16/10* (2006.01)
  *H01L 25/065* (2023.01)
  *H01L 25/18* (2023.01)
  *H01L 23/00* (2006.01)
  *G11C 29/10* (2006.01)
  *G11C 16/16* (2006.01)

(52) U.S. Cl.
  CPC ...... *G11C 11/5671* (2013.01); *G11C 16/0483* (2013.01); *G11C 16/10* (2013.01); *G11C 16/16* (2013.01); *G11C 29/10* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
  CPC ......... G11C 16/10; G11C 16/16; G11C 29/10; G11C 2029/0403; G11C 29/025; G11C 29/04; G11C 29/06; G11C 16/08; G11C 29/50004; G11C 16/3422; G11C 16/14; G11C 16/3459; H01L 24/08; H01L 25/0657; H01L 25/18; H01L 2224/08145; H01L 2924/1431; H01L 2924/14511; H01L 2225/06527; H01L 2225/06541; H10B 41/30

USPC .................................................. 365/185.23
  See application file for complete search history.

(56) References Cited

U.S. PATENT DOCUMENTS

| | | | |
|---|---|---|---|
| 7,679,133 B2 | 3/2010 | Son et al. | |
| 8,429,334 B2 | 4/2013 | Ou | |
| 8,520,453 B2 | 8/2013 | Wang et al. | |
| 8,553,466 B2 | 10/2013 | Han et al. | |
| 8,559,235 B2 | 10/2013 | Yoon et al. | |
| 8,586,982 B2 | 11/2013 | LaCroix et al. | |
| 8,654,587 B2 | 2/2014 | Yoon et al. | |
| 9,472,270 B2 | 10/2016 | Liang et al. | |
| 10,629,284 B2 | 4/2020 | Yano | |
| 2011/0233648 A1 | 9/2011 | Seol et al. | |
| 2014/0108747 A1* | 4/2014 | Seol | G06F 11/1048 711/154 |
| 2019/0172544 A1* | 6/2019 | Kim | G11C 16/3427 |
| 2020/0058359 A1* | 2/2020 | Lee | G11C 16/3495 |
| 2021/0005265 A1* | 1/2021 | Lee | G11C 16/08 |
| 2022/0093179 A1* | 3/2022 | Lee | G11C 16/30 |
| 2022/0238173 A1* | 7/2022 | Yang | G06F 12/0246 |
| 2022/0336026 A1* | 10/2022 | Tang | G11C 29/24 |
| 2023/0049605 A1* | 2/2023 | Tomiie | G11C 16/0433 |
| 2023/0170025 A1* | 6/2023 | Lee | G11C 16/3459 365/185.11 |

\* cited by examiner

FIG. 5
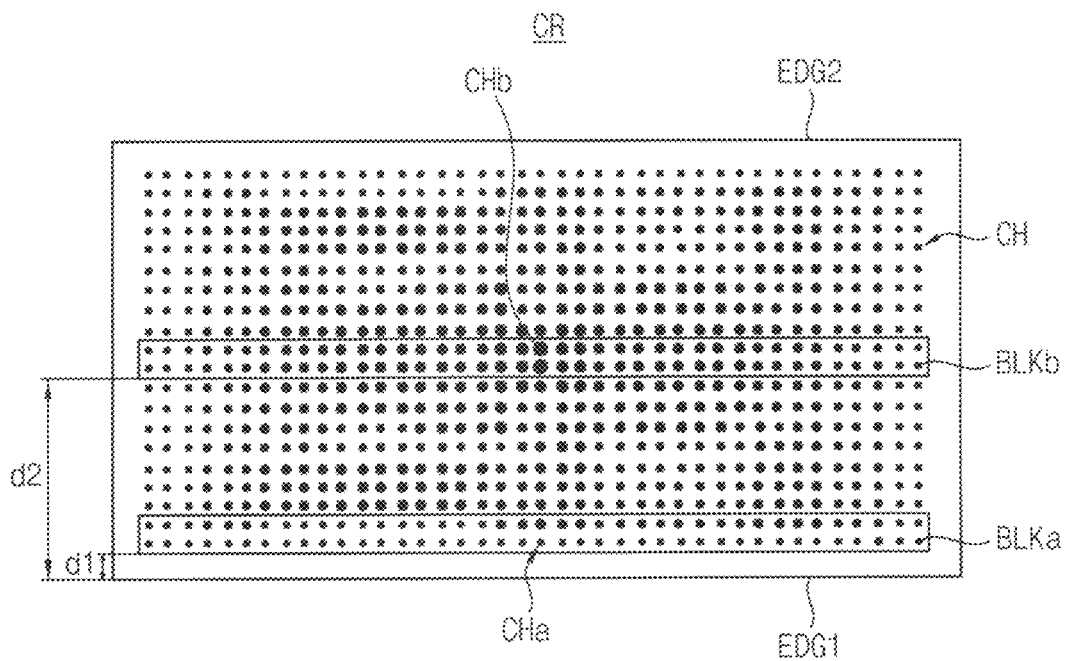
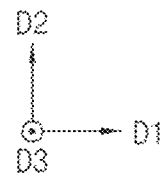

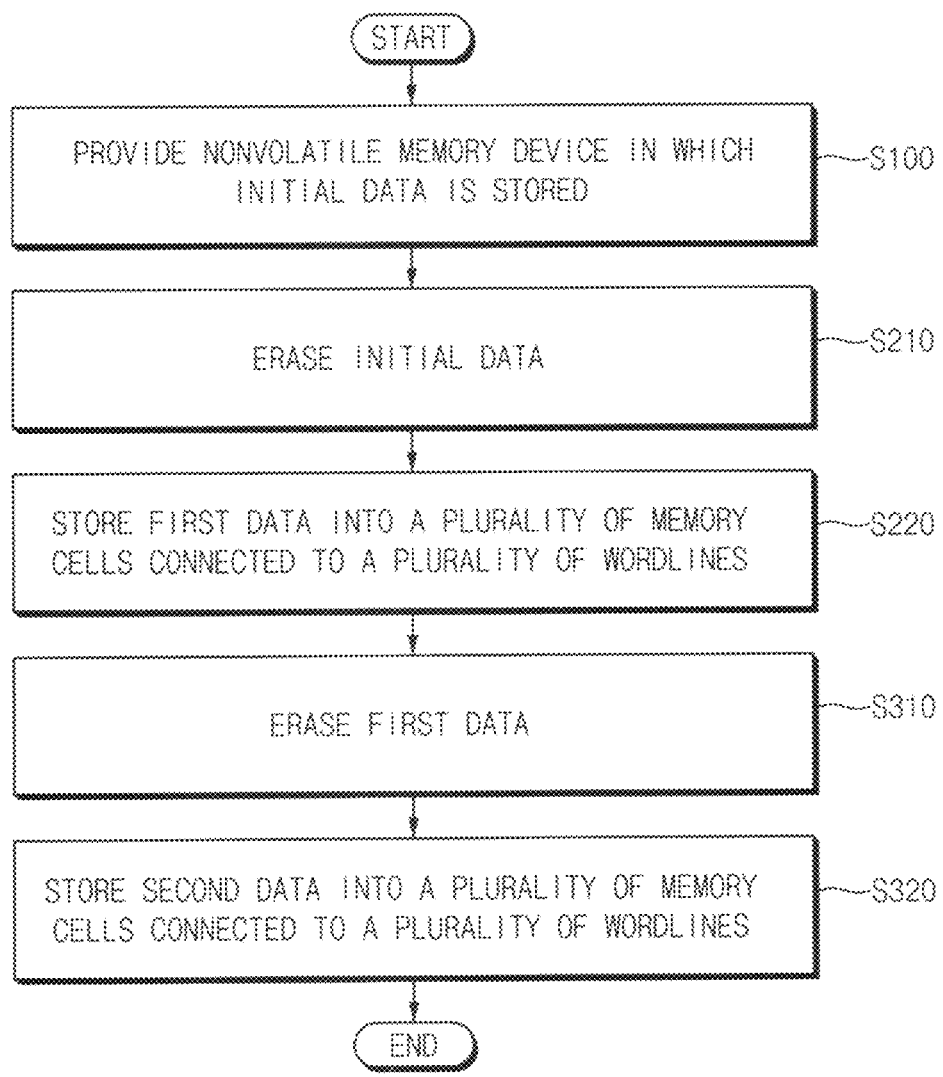

FIG. 10A
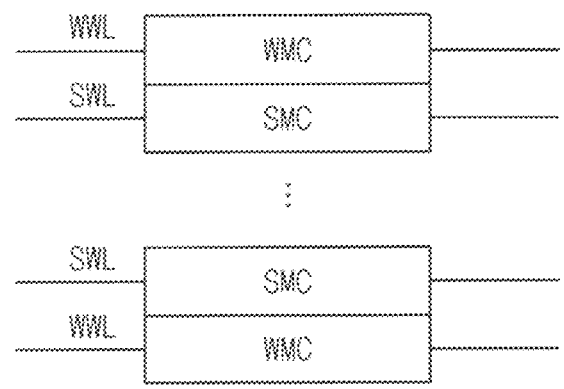
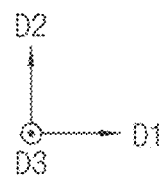
FIG. 10B
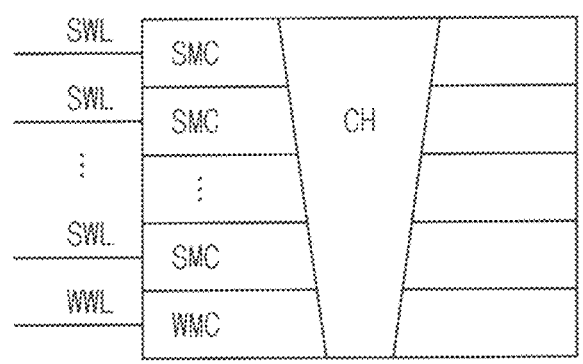
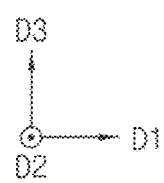

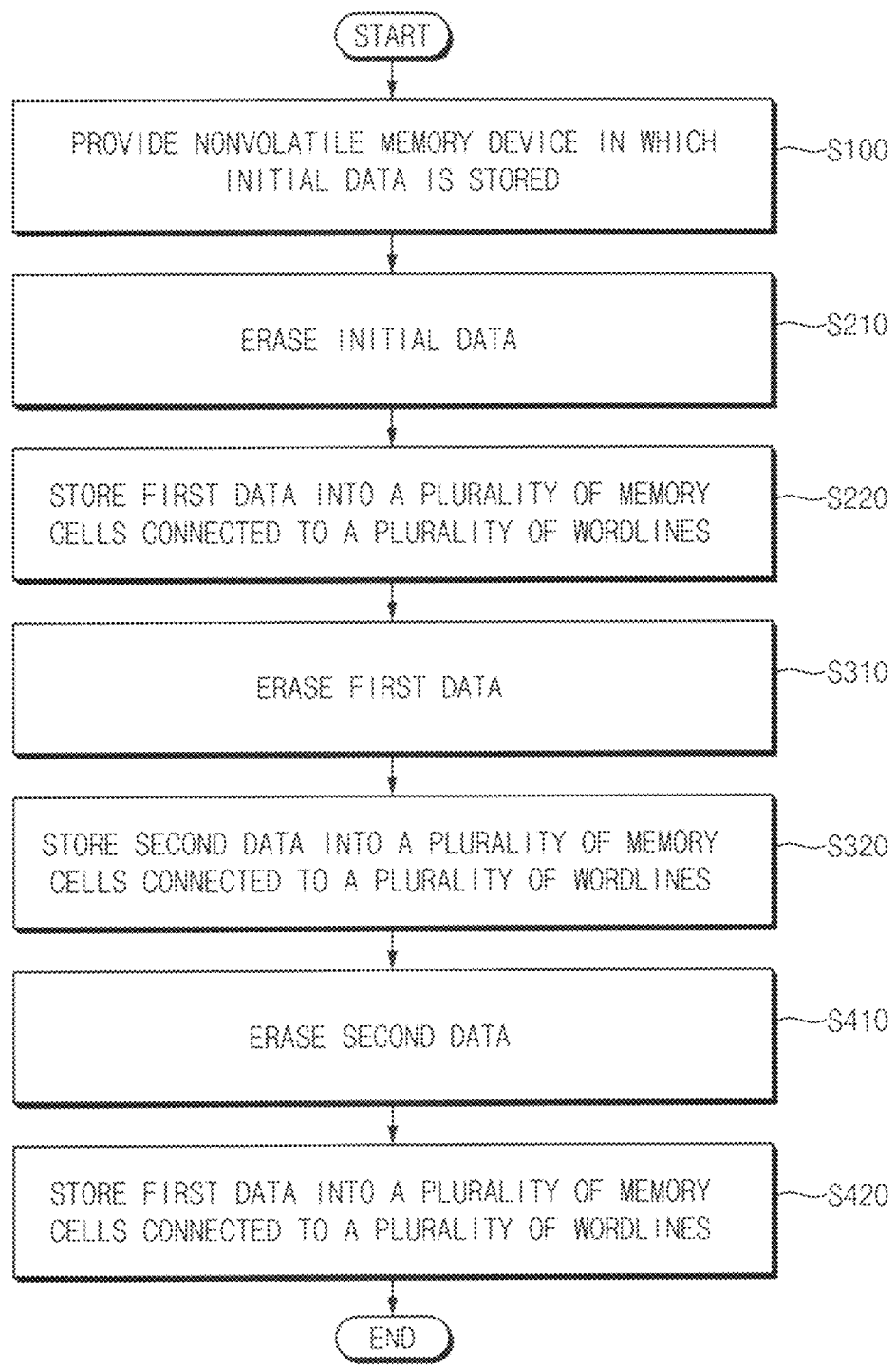

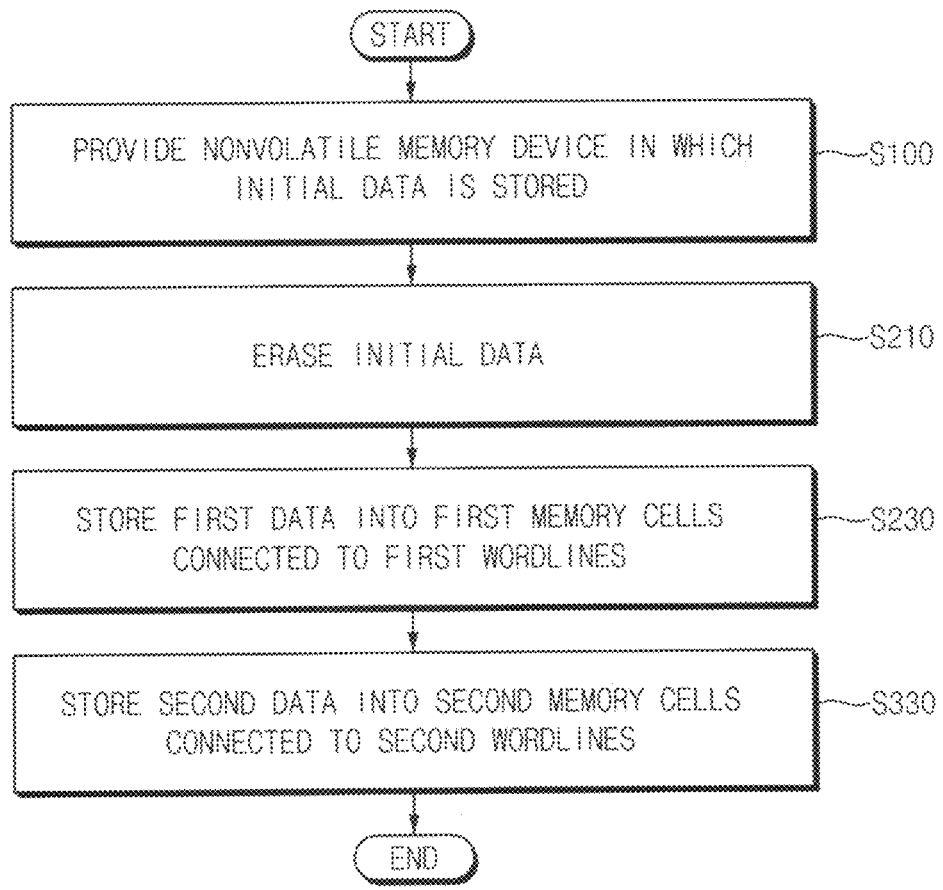

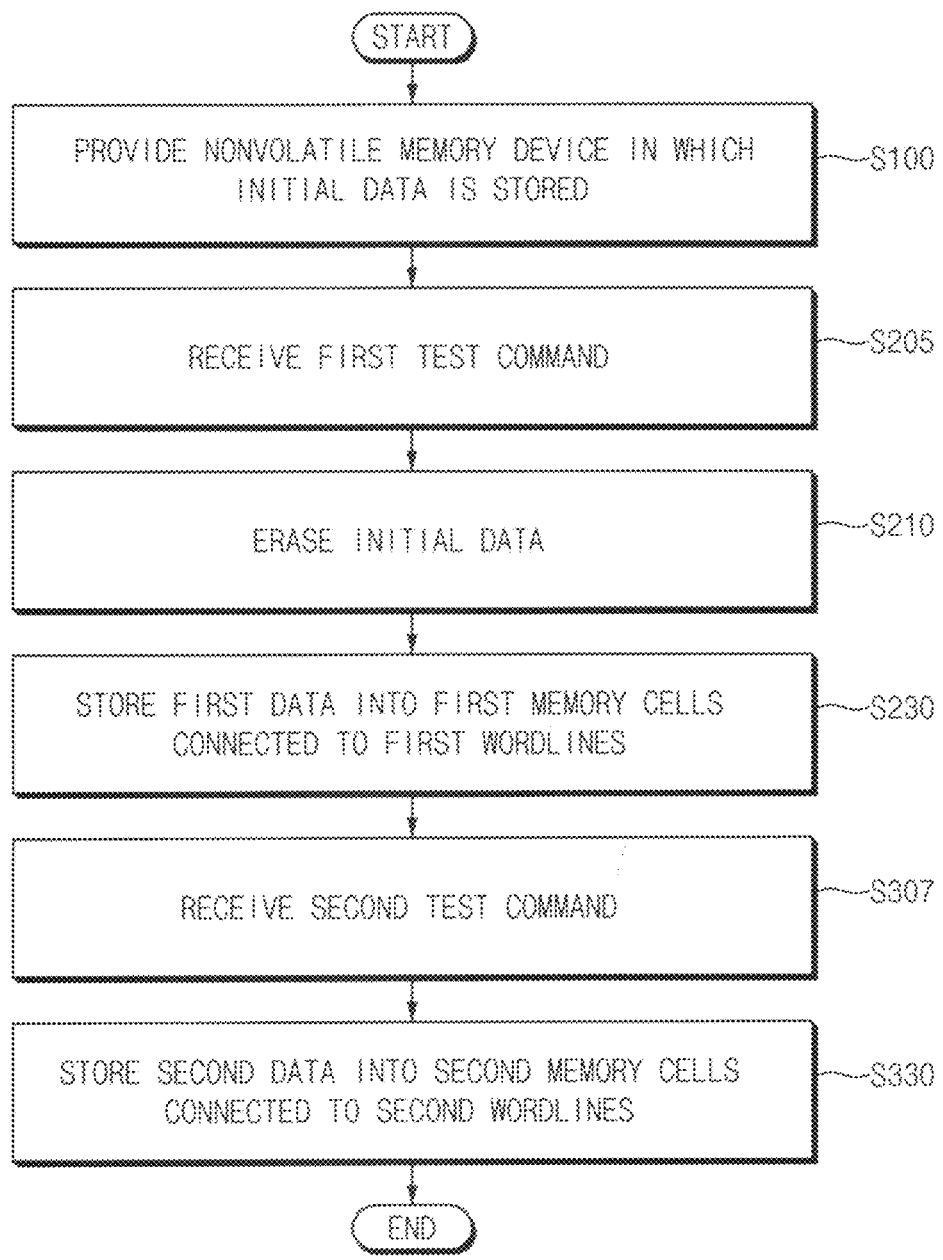

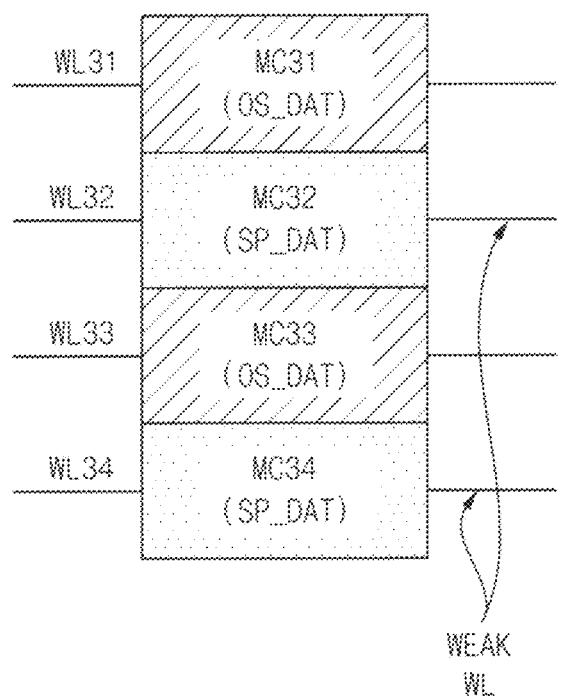

METHOD OF REDUCING RELIABILITY DEGRADATION OF NONVOLATILE MEMORY DEVICE, NONVOLATILE MEMORY DEVICE USING THE SAME AND METHOD OF TESTING NONVOLATILE MEMORY DEVICE USING THE SAME

CROSS-REFERENCE TO RELATED APPLICATION

This application claims priority under 35 USC § 119 to Korean Patent Application No. 10-2021-0118285 filed on Sep. 6, 2021 in the Korean Intellectual Property Office (KIPO), the contents of which are herein incorporated by reference in their entirety.

BACKGROUND

1. Technical Field

Example embodiments relate generally to semiconductor integrated circuits, and more particularly to methods of reducing reliability degradation of nonvolatile memory devices, and nonvolatile memory devices and methods of testing nonvolatile memory devices using the methods of reducing reliability degradation.

2. Description of the Related Art

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered. When a specific process is performed while manufacturing complete products using nonvolatile memory devices, reliability degradation may occur on memory cells included in the nonvolatile memory devices.

SUMMARY

At least one example embodiment of the inventive concepts provides a method of efficiently reducing and/or preventing reliability degradation of memory cells included in a nonvolatile memory device.

At least one example embodiment of the inventive concepts provides a nonvolatile memory device using the method of reducing reliability degradation.

At least one example embodiment of the inventive concepts provides a method of testing a nonvolatile memory device using the method of reducing reliability degradation.

According to at least some example embodiments of the inventive concepts, a method of reducing reliability degradation of a nonvolatile memory device that includes a plurality of memory cells connected to a plurality of wordlines includes providing the nonvolatile memory device in which initial data having an initial threshold voltage distribution is stored in the plurality of memory cells connected to the plurality of wordlines; before a first process is performed on the nonvolatile memory device, performing a first write operation such that first data having a first threshold voltage distribution is stored into memory cells connected to first wordlines, the first process being a process that causes reliability degradation of the plurality of memory cells, the first threshold voltage distribution being different from the initial threshold voltage distribution, the first wordlines having a degree of reliability degradation less than a reference value among the plurality of wordlines; and before the first process is performed on the nonvolatile memory device, performing a second write operation such that second data having a second threshold voltage distribution is stored into memory cells connected to second wordlines, the second threshold voltage distribution being different from the first threshold voltage distribution, the second wordlines having a degree of reliability degradation greater than or equal to the reference value among the plurality of wordlines.

According to at least some example embodiments of the inventive concepts, a nonvolatile memory device includes a memory cell array including a plurality of memory cells connected to a plurality of wordlines; and a control circuit configured to control an operation of the memory cell array, wherein the control circuit is configured to provide the nonvolatile memory device in which initial data having an initial threshold voltage distribution is stored in the plurality of memory cells connected to the plurality of wordlines, before a first process is performed on the nonvolatile memory device, perform a first write operation such that first data having a first threshold voltage distribution is stored into memory cells connected to first wordlines, the first process being a process that causes reliability degradation of the plurality of memory cells, the first threshold voltage distribution being different from the initial threshold voltage distribution, the first wordlines having a degree of reliability degradation less than a reference value among the plurality of wordlines, and before the first process is performed on the nonvolatile memory device, perform a second write operation such that second data having a second threshold voltage distribution is stored into memory cells connected to second wordlines, the second threshold voltage distribution being different from the first threshold voltage distribution, the second wordlines having a degree of reliability degradation greater than or equal to the reference value among the plurality of wordlines.

According to at least some example embodiments of the inventive concepts, a method of testing a nonvolatile memory device that includes a plurality of memory cells connected to a plurality of wordlines includes providing the nonvolatile memory device in which initial data is stored in the plurality of memory cells connected to the plurality of wordlines, the initial data having an initial threshold voltage distribution that includes only a first state; before a solder reflow process is performed on the nonvolatile memory device, performing a first write operation such that first data is stored into memory cells connected to first wordlines from among the plurality of wordlines, the solder reflow process being a manufacturing process in which thermal stress is applied to the nonvolatile memory device, the first data having a first threshold voltage distribution that is different from the initial threshold voltage distribution and includes a plurality of states, the first wordlines having a degree of reliability degradation less than a reference value among the plurality of wordlines; performing a first test operation on the nonvolatile memory device; before the solder reflow process is performed on the nonvolatile memory device, performing a second write operation such that second data is stored into memory cells connected to second wordlines from among the plurality of wordlines, the second data having a second threshold voltage distribution that is different from the first threshold voltage distribution and includes only a second state, the second wordlines having a degree of reliability degradation greater than or equal to the reference value among the plurality of wordlines; performing the solder reflow process on the nonvolatile memory device; and performing a second test operation on the nonvolatile memory device, wherein each of the first state and the second state are included in the plurality of states, wherein the second data is more robust against reliability degradation than the first data, and wherein the first test operation is performed before the second write operation or after the second write operation.

In the method of reducing reliability degradation of the nonvolatile memory device according to at least some example embodiments of the inventive concepts, the nonvolatile memory device and the method of testing the nonvolatile memory device according to at least some example embodiments of the inventive concepts, the data that is robust against the reliability degradation (e.g., resistant to reliability degradation) may be stored into the memory cells connected to the wordlines that are vulnerable to the reliability degradation, before the process causing the reliability degradation is performed on the nonvolatile memory device. Accordingly, even if the process causing the reliability degradation is performed thereafter, the reliability degradation of the memory cells connected to the wordlines that are vulnerable to the reliability degradation may be reduced and/or prevented.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 5 is a plan view of an example of a cell region included in a memory cell array of FIGS. 3 and 4.

FIG. 7 is a flowchart illustrating an example of a method of reducing reliability degradation of a nonvolatile memory device of FIG. 1.

FIGS. 8A, 8B, 8C, 9A, 9B, 9C, 10A and 10B are diagrams for describing an operation of FIG. 7.

FIGS. 11 and 12 are flowcharts illustrating other examples of a method of reducing reliability degradation of a nonvolatile memory device of FIG. 1.

FIG. 13 is a flowchart illustrating an example of a method of reducing reliability degradation of a nonvolatile memory device of FIG. 1.

FIG. 15 is a flowchart illustrating an example of a method of reducing reliability degradation of a nonvolatile memory device of FIG. 1.

FIGS. 16A, 16B and 16C are diagrams for describing an operation of FIG. 15.

DETAILED DESCRIPTION OF THE EMBODIMENTS

Figure 1:
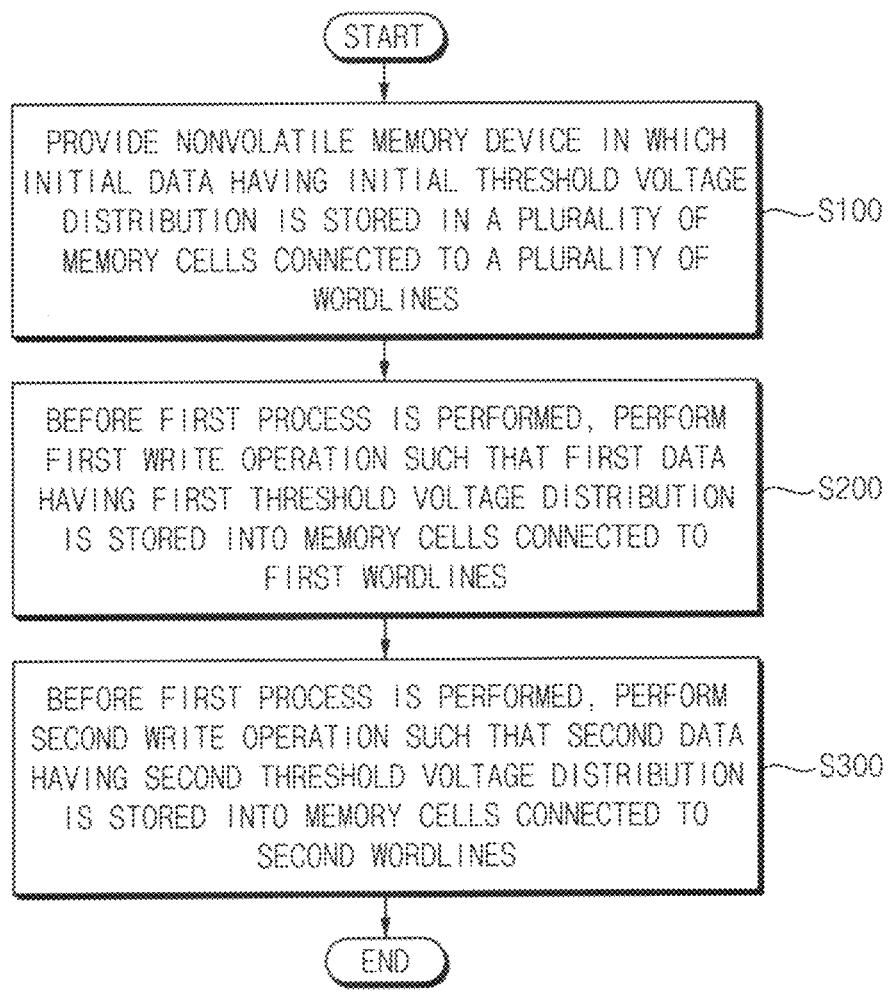
FIG. 1 is a flowchart illustrating a method of reducing reliability degradation of a nonvolatile memory device according to at least some example embodiments of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a flowchart illustrating a method of reducing reliability degradation of a nonvolatile memory device according to at least some example embodiments of the inventive concepts.

Referring to FIG. 1, a method of reducing reliability degradation (or deterioration) according to at least some example embodiments of the inventive concepts is performed by a nonvolatile memory device that includes a memory cell array and a control circuit. The memory cell array includes a plurality of memory cells connected to a plurality of wordlines. The control circuit controls an operation of the memory cell array. A configuration of the nonvolatile memory device will be described in detail with reference to FIGS. 2 through 6.

In the method of reducing reliability degradation of the nonvolatile memory device according to at least some example embodiments of the inventive concepts, the nonvolatile memory device in which initial data is already stored or written in the plurality of memory cells connected to the plurality of wordlines is provided (step S100). The initial data has an initial threshold voltage distribution (or an initial distribution of threshold voltages). For example, the nonvolatile memory device in which the initial data is stored may be provided or shipped to a customer who intends or wants to use the nonvolatile memory device (e.g., a customer who intends or wants to manufacture a system (or a complete product or finished product) including the nonvolatile memory device).

Before a first process is performed on the nonvolatile memory device, a first write operation is performed on the nonvolatile memory device such that first data is stored or written into memory cells connected to first wordlines (step S200). The first process is a manufacturing process that is performed for fabricating the complete product including the nonvolatile memory device and causes reliability degradation of the plurality of memory cells included in the nonvolatile memory device. The first data has a first threshold voltage distribution (or a first distribution of threshold voltages) that is different from the initial threshold voltage distribution. Among the plurality of wordlines, the first wordlines are wordlines having a degree of reliability degradation less than (or expected to be less than) a reference value. In other words, the first wordlines may represent wordlines in which the amount of reliability degradation is relatively small or wordlines that are relatively robust against reliability degradation (e.g., more resistant to reliability degradation). The first wordlines may be referred to as strong wordlines. For example, step S200 may be performed by the customer.

Before the first process is performed on the nonvolatile memory device, a second write operation is performed on the nonvolatile memory device such that second data is stored into memory cells connected to second wordlines (step S300). The second data has a second threshold voltage distribution (or a second distribution of threshold voltages) that is different from the first threshold voltage distribution. Among the plurality of wordlines, the second wordlines are wordlines having a degree of reliability degradation greater than or equal to (or expected to be greater than or equal to) the reference value. In other words, the second wordlines may represent wordlines in which the amount of reliability degradation is relatively large or wordlines that are relatively vulnerable to reliability degradation. The second wordlines may be referred to as weak wordlines. For example, step S300 may be performed by the customer or may be performed by the nonvolatile memory device by itself.

In some example embodiments, the first process may include a solder reflow process in which thermal stress is applied to the nonvolatile memory device. For example, the solder reflow process may include an infrared (IR) reflow process. As the first process is performed, the nonvolatile memory device (or a chip including the nonvolatile memory device) may be attached to or detached from a substrate such as a printed circuit board (PCB). However, example embodiments are not limited thereto, and the first process may include at least one of various processes that cause the reliability degradation.

In some example embodiments, the first process may be performed during a test process that is performed by the customer who intends to use the nonvolatile memory device.

For example, the test process may include an in-process test that is performed to fabricate the system including the nonvolatile memory device, and may include various series of test operations. In this example, step S200 may be performed before the test process starts, and step S300 may be performed before the test process starts or may be performed just before the first process is performed after some test operations are performed during the test process. In addition, the remaining test operations may be performed after step S300 is performed.

In some example embodiments, the first data may be data used to perform the test process. To perform the test process, it is necessary to drive or operate the nonvolatile memory device and the system including the nonvolatile memory device, and the first data may be data for driving or operating the nonvolatile memory device and the system. For example, the first data may include an operating system (OS) for driving or operating the nonvolatile memory device and the system, and the first data may be referred to as OS data.

In some example embodiments, the second data may be data used to reduce and/or prevent the reliability degradation of the memory cells connected to the second wordlines during the test process. For example, the degree and/or amount of reliability degradation of memory cells may vary depending on a threshold voltage distribution or pattern of data stored in the memory cells, and the second data may be data more robust against reliability degradation (e.g., more resistant to reliability degradation) than the first data. The second data may be referred to as solid pattern data.

In some example embodiments, the first wordlines and the second wordlines may be defined depending on an arrangement of the plurality of wordlines in a memory block. An example arrangement of the first and second wordlines will be described with reference to FIG. 10.

According to at least some example embodiments of the inventive concepts, when step S200 is performed, the first data may be stored only into the memory cells connected to the first wordlines, or may be stored into all of the plurality of memory cells connected to the plurality of wordlines. According to at least some example embodiments of the inventive concepts, when step S300 is performed, the second data may be stored only into the memory cells connected to the second wordlines, or may be stored into all of the plurality of memory cells connected to the plurality of wordlines. According to at least some example embodiments of the inventive concepts, steps S200 and S300 may be sequentially performed, or may be substantially simultaneously or concurrently performed. Example operations of steps S200 and S300 will be described with reference to FIGS. 7 through 16.

The degree and/or amount of reliability degradation of memory cells may vary depending on a threshold voltage distribution or pattern of data stored in the memory cells. Even if a nonvolatile memory device is provided or shipped by storing initial data that is robust against reliability degradation (e.g., resistant to reliability degradation), data that is vulnerable to reliability degradation may be stored into the nonvolatile memory device during use and/or test by a customer.

In the method of reducing reliability degradation of the nonvolatile memory device according to at least some example embodiments of the inventive concepts, the second data that is robust against the reliability degradation (e.g., resistant to reliability degradation) may be stored into the memory cells connected to the second wordlines that are vulnerable to the reliability degradation, before the first process causing the reliability degradation is performed on the nonvolatile memory device. Accordingly, even if the first process causing the reliability degradation is performed thereafter, the reliability degradation of the memory cells connected to the second wordlines that are vulnerable to the reliability degradation may be reduced and/or prevented based on the second data stored in the memory cells connected to the second wordlines.

Figure 2:
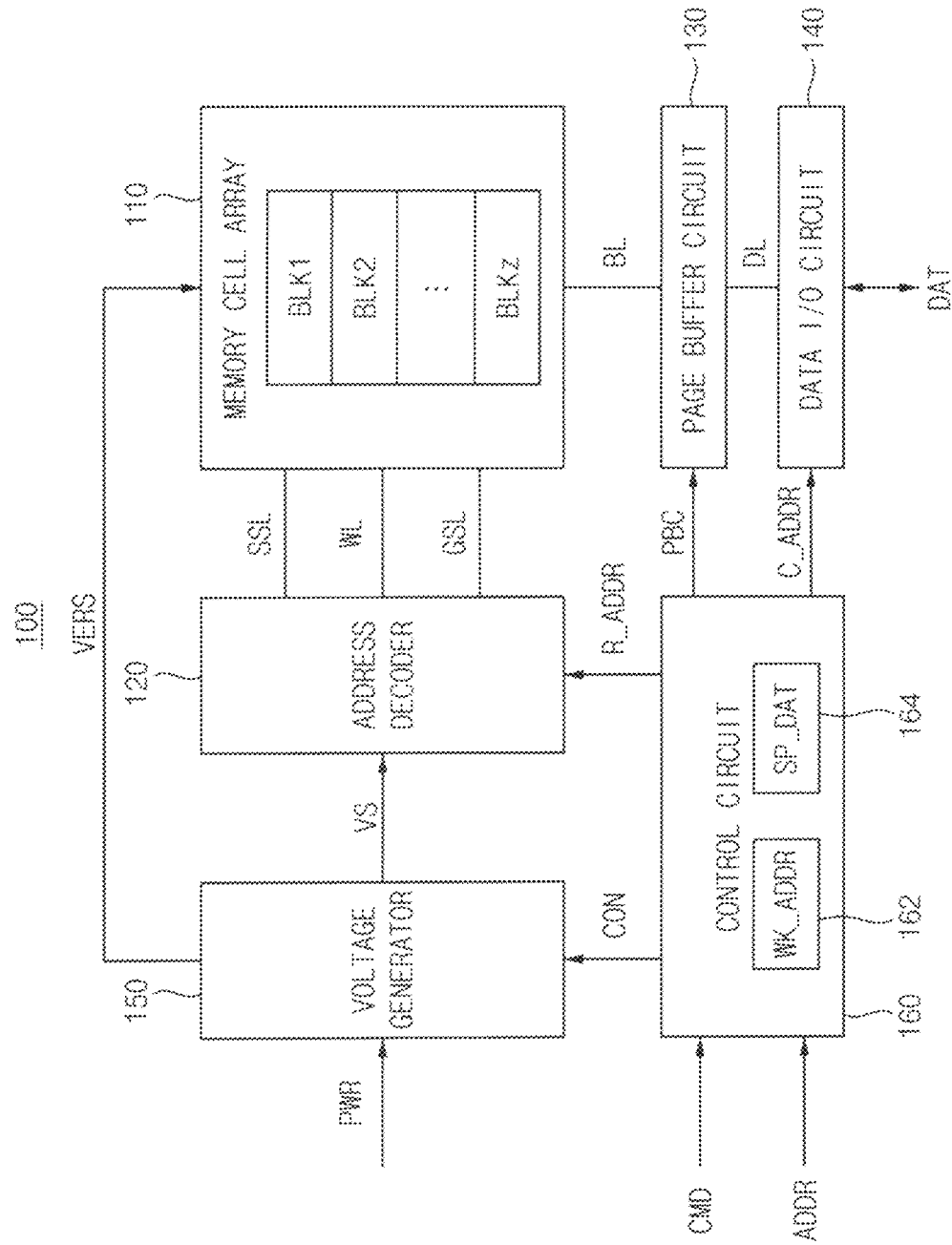
FIG. 2 is a block diagram illustrating a nonvolatile memory device according to at least some example embodiments of the inventive concepts.

FIG. 2 is a block diagram illustrating a nonvolatile memory device according to at least some example embodiments of the inventive concepts.

Referring to FIG. 2, a nonvolatile memory device 100 includes a memory cell array 110, an address decoder 120, a page buffer circuit 130, a data input/output (I/O) circuit 140, a voltage generator 150 and a control circuit 160. According to at least some example embodiments of the inventive concepts, the nonvolatile memory device 100 and/or elements thereof (e.g., memory cell array 110, address decoder 120, page buffer circuit 130, data input/output (I/O) circuit 140, voltage generator 150 and/or a control circuit 160) may be, or include, processing circuitry such as hardware including logic circuits; a hardware/software combination executing software; or a combination thereof. For example, the processing circuitry more specifically may include, but is not limited to, one or more of a central processing unit (CPU), a processor core, an arithmetic logic unit (ALU), a digital signal processor, a microcomputer, a field programmable gate array (FPGA), a programmable logic unit, a microprocessor, an application-specific integrated circuit (ASIC), etc.

The memory cell array 110 is connected to the address decoder 120 via a plurality of string selection lines SSL, a plurality of wordlines WL and a plurality of ground selection lines GSL. The memory cell array 110 is further connected to the page buffer circuit 130 via a plurality of bitlines BL. The memory cell array 110 may include a plurality of memory cells (e.g., a plurality of nonvolatile memory cells) that are connected to the plurality of wordlines WL and the plurality of bitlines BL. The memory cell array 110 may be divided into a plurality of memory blocks BLK1, BLK2, . . . , BLKz each of which includes memory cells. In addition, each of the plurality of memory blocks BLK1, BLK2, . . . , BLKz may be divided into a plurality of pages.

In some example embodiments, as will be described with reference to FIGS. 3 and 4, the memory cell array 110 may be a three-dimensional (3D) memory cell array, which is formed on a substrate in a three-dimensional structure (or a vertical structure). In this example, the memory cell array 110 may include a plurality of cell strings (e.g., a plurality of vertical NAND strings) that are vertically oriented such that at least one memory cell is located over another memory cell.

The control circuit 160 receives a command CMD and an address ADDR from an outside (e.g., from a memory controller which is not illustrated), and control erasure, programming and read operations of the nonvolatile memory device 100 based on the command CMD and the address ADDR. An erasure operation may include performing a sequence of erase loops, and a programming operation may include performing a sequence of program loops. Each program loop may include a program operation and a program verification operation. Each erase loop may include an erase operation and an erase verification operation. The read operation may include a normal read operation and data recover read operation.

For example, the control circuit 160 may generate control signals CON, which are used for controlling the voltage generator 150, and may generate control signal PBC for controlling the page buffer circuit 130, based on the command CMD, and may generate a row address R_ADDR and a column address C_ADDR based on the address ADDR. The control circuit 160 may provide the row address R_ADDR to the address decoder 120 and may provide the column address C_ADDR to the data I/O circuit 140.

In addition, the control circuit 160 may control the address decoder 120, the page buffer circuit 130, the data I/O circuit 140 and the voltage generator 150 such that the nonvolatile memory device 100 performs the method of reducing reliability degradation according to at least some example embodiments of the inventive concepts described with reference to FIG. 1. For example, the control circuit 160 may store initial data into the plurality of memory cells connected to the plurality of wordlines WL such that the nonvolatile memory device 100 storing the initial data is provided, may store first data into memory cells connected to first wordlines that are robust against reliability degradation (e.g., resistant to reliability degradation) before the first process causing reliability degradation is performed, and may store second data (SP_DAT) 164 into memory cells connected to second wordlines that are vulnerable to reliability degradation before the first process is performed. For example, the control circuit 160 may include an address (WK_ADDR) 162 of the second wordlines and the second data 164.

The address decoder 120 may be connected to the memory cell array 110 via the plurality of string selection lines SSL, the plurality of wordlines WL and the plurality of ground selection lines GSL.

For example, in the data erase/write/read operations, the address decoder 120 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the address decoder 120 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 120 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 150 may generate voltages VS that are required for an operation of the nonvolatile memory device 100 based on a power PWR and the control signals CON. The voltages VS may be applied to the plurality of string selection lines SSL, the plurality of wordlines WL and the plurality of ground selection lines GSL via the address decoder 120. In addition, the voltage generator 150 may generate an erase voltage VERS that is required for the data erase operation based on the power PWR and the control signals CON. The erase voltage VERS may be applied to the memory cell array 110 directly or via the bitline BL.

For example, during the erase operation, the voltage generator 150 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the address decoder 120. In addition, during the erase verification operation, the voltage generator 150 may apply an erase verification voltage simultaneously to all wordlines of the memory block or sequentially to the wordlines one by one via the address decoder 120.

For example, during the program operation, the voltage generator 150 may apply a program voltage to the selected wordline and may apply a program pass voltage to the unselected wordlines via the address decoder 120. In addition, during the program verification operation, the voltage generator 150 may apply a program verification voltage to the selected wordline and may apply a verification pass voltage to the unselected wordlines via the address decoder 120.

In addition, during the normal read operation, the voltage generator 150 may apply a read voltage to the selected wordline and may apply a read pass voltage to the unselected wordlines via the address decoder 120. During the data recover read operation, the voltage generator 150 may apply the read voltage to a wordline adjacent to the selected wordline and may apply a recover read voltage to the selected wordline via the address decoder 120.

The page buffer circuit 130 may be connected to the memory cell array 110 via the plurality of bitlines BL. The page buffer circuit 130 may include a plurality of page buffers. In some example embodiments, each page buffer may be connected to one bitline. In other example embodiments, each page buffer may be connected to two or more bitlines.

The page buffer circuit 130 may store data DAT to be programmed into the memory cell array 110 or may read data DAT sensed from the memory cell array 110. In other words, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from the outside of the nonvolatile memory device 100 to the memory cell array 110 via the page buffer circuit 130 or may provide the data DAT from the memory cell array 110 to the outside of the nonvolatile memory device 100, based on the column address C_ADDR.

Figure 3:
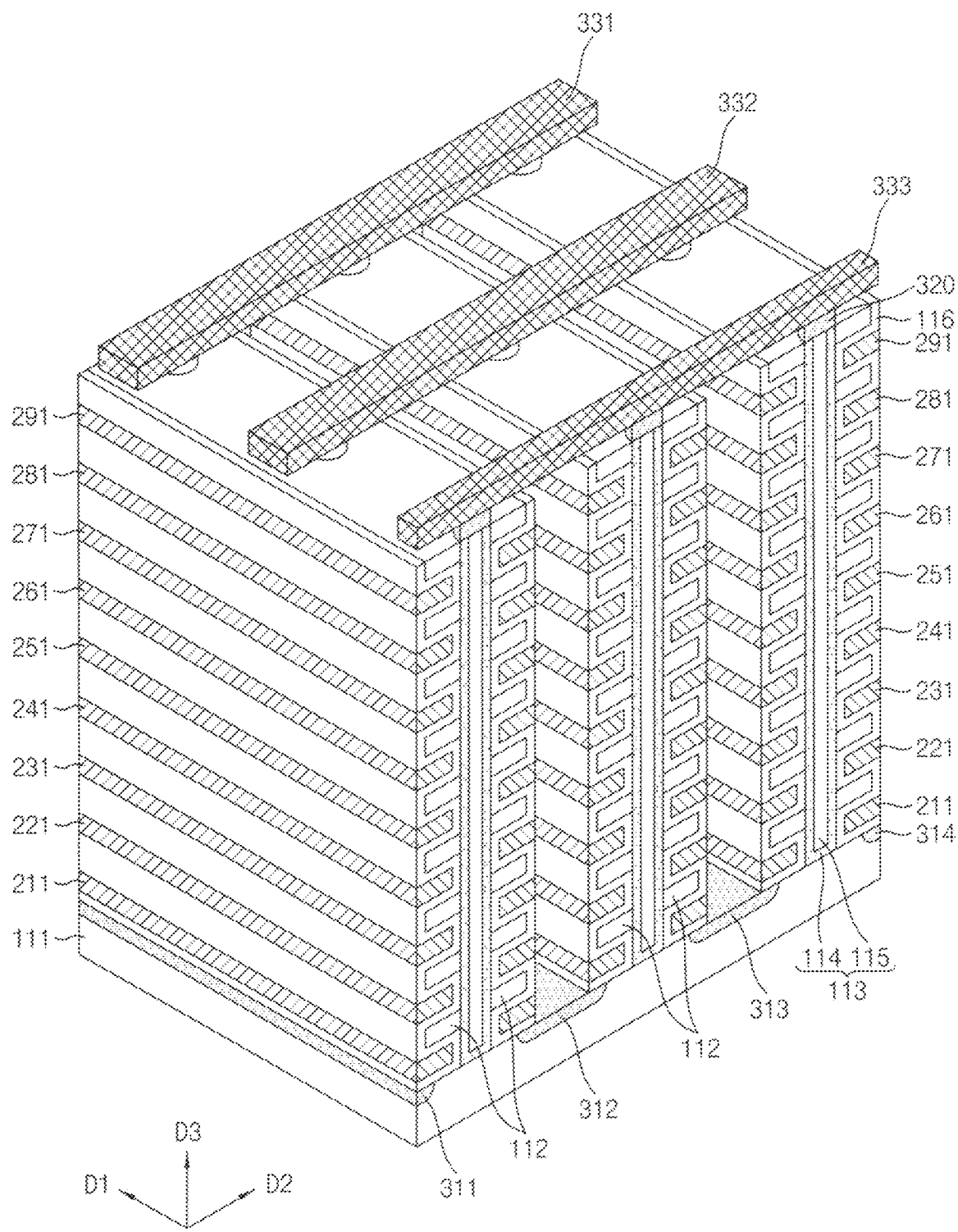
FIG. 3 is a perspective view of an example of a memory block included in a memory cell array included in a nonvolatile memory device of FIG. 2.

FIG. 3 is a perspective view of an example of a memory block included in a memory cell array included in a nonvolatile memory device of FIG. 2.

Referring to FIG. 3, a memory block BLKi includes a plurality of cell strings (e.g., a plurality of vertical NAND strings) which are formed on a substrate in a three-dimensional structure (or a vertical structure). The memory block BLKi includes structures extending along the first, second and third directions D1, D2 and D3.

A substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. According to at least one example embodiment of the inventive concepts, the substrate 111 has a p-type well (or a p-type pocket well). However, the conductive type of the substrate 111 is not limited to p-type.

A plurality of doping regions 311, 312, 313 and 314 arranged along the second direction D2 are provided in/on the substrate 111. These plurality of doping regions 311 to 314 may have a second type of charge carrier impurity (e.g., a second conductivity type) different from the first type of the substrate 111. According to at least one example embodiment of the inventive concepts, the first to fourth doping regions 311 to 314 may have n-type. However, the conductive type of the first to fourth doping regions 311 to 314 is not limited to n-type.

A plurality of insulation materials 112 extending along the first direction D1 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include an insulation material such as an oxide layer.

A plurality of pillars 113 penetrating the insulation materials along the third direction D3 are sequentially disposed along the first direction D1 on a region of the substrate 111 between the first and second doping regions 311 and 312. For example, the plurality of pillars 113 penetrate the insulation materials 112 to contact the substrate 111.

In some example embodiments, each pillar 113 may include a plurality of materials. For example, a channel layer 114 of each pillar 113 may include a silicon material having a first conductivity type. For example, the channel layer 114 of each pillar 113 may include a silicon material having the same conductivity type as the substrate 111. According to at least one example embodiment of the inventive concepts, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the internal material 115 of each pillar 113 may include an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). In this example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal. However, at least some example embodiments of the inventive concepts are not limited to this example. For example, according to at least some example embodiments of the inventive concepts, the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction D1. And, a plurality of pillars 113 are provided that are disposed sequentially along the first direction D1 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 may be provided in a region between the third and fourth doping regions 313 and 314.

A plurality of drain regions 320 are provided on the plurality of pillars 113, respectively. The drain regions 320 may include silicon materials doped with a second type of charge carrier impurity. For example, the drain regions 320 may include silicon materials doped with an n-type dopant. According to at least one example embodiment of the inventive concepts, the drain regions 320 include n-type silicon materials. However, according to at least some example embodiments of the inventive concepts, the drain regions 320 are not limited to n-type silicon materials and may include materials other than the n-type silicon materials.

On the drain regions, a plurality of second conductive materials 331, 332 and 333 are provided, which extend along the second direction D2. The second conductive materials 331 to 333 are disposed along the first direction D1, being spaced apart from each other by a specific distance. The second conductive materials 331 to 333 are respectively connected to the drain regions 320 in a corresponding region. The drain regions 320 and the second conductive material 333 extending along the second direction D2 may be connected through each contact plug. Each contact plug may be, for example, a conductive plug formed of a conductive material such as a metal. The second conductive materials 331 to 333 may include metal materials. The second conductive materials 331 to 333 may include conductive materials such as a polysilicon.

In the example of FIG. 3, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be changed variously according to process and control techniques.

Figure 4:
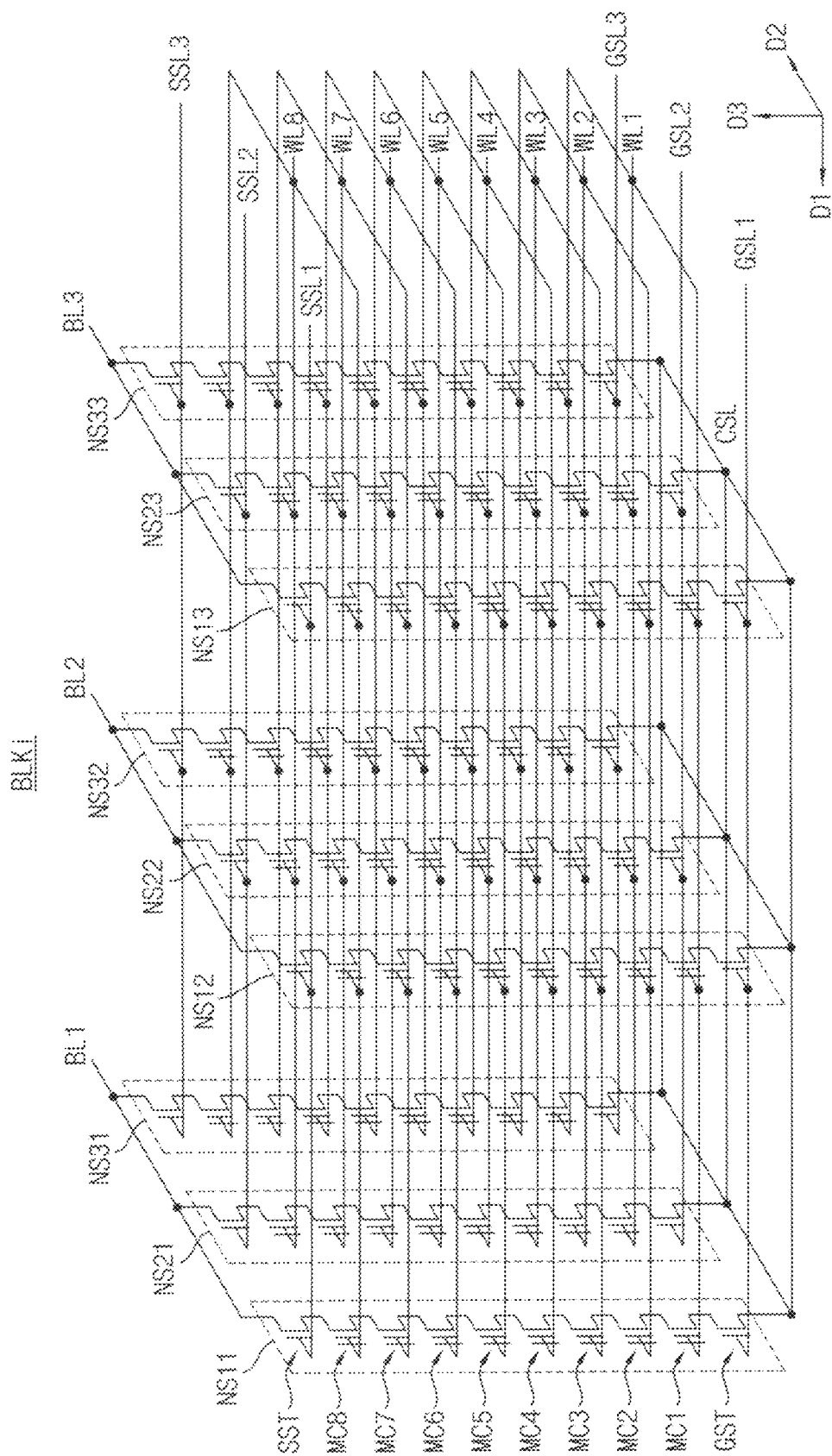
FIG. 4 is a circuit diagram illustrating an equivalent circuit of a memory block described with reference to FIG. 3.

FIG. 4 is a circuit diagram illustrating an equivalent circuit of a memory block described with reference to FIG. 3.

A memory block BLKi of FIG. 4 may be formed on a substrate in a three-dimensional structure (or a vertical structure). For example, a plurality of NAND strings included in the memory block BLKi may be formed in a direction perpendicular to the substrate.

Referring to FIG. 4, the memory block BLKi may include a plurality of NAND strings NS11, NS12, NS13, NS21, NS22, NS23, NS31, NS32 and NS33 connected between bitlines BL1, BL2 and BL3 and a common source line CSL. Each of the NAND strings NS11 to NS33 may include a string selection transistor SST, a plurality of memory cells MC1, MC2, MC3, MC4, MC5, MC6, MC7 and MC8, and a ground selection transistor GST. For example, the bitlines BL1 to BL3 may correspond to the second conductive materials 331 to 333 in FIG. 3, and the common source line CSL may be formed by interconnecting the first to fourth doping regions 311 to 314 in FIG. 3.

Each string selection transistor SST may be connected to a corresponding string selection line (one of SSL1, SSL2 and SSL3). The plurality of memory cells MC1 to MC8 may be connected to corresponding wordlines WL1, WL2, WL3, WL4, WL5, WL6, WL7 and WL8, respectively. Each ground selection transistor GST may be connected to a corresponding ground selection line (one of GSL1, GSL2 and GSL3). Each string selection transistor SST may be connected to a corresponding bitline (e.g., one of BL1 to BL3), and each ground selection transistor GST may be connected to the common source line CSL. In the example of FIG. 4, some of the string selection transistors SST are connected to the same bitline (e.g., one of BL1 to BL3) to connect corresponding NAND strings to the same bitline up appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer share a wordline. Cell strings in the same row share a string selection line. The common source line CSL is connected in common to all of cell strings.

In FIG. 4, the memory block BLKi is illustrated to be connected to eight wordlines WL1 to WL8 and three bitlines BL1 to BL3, and each of the NAND strings NS11 to NS33 is illustrated to include eight memory cells MC1 to MC8. However, example embodiments are not limited thereto. In some example embodiments, each memory block may be connected to any number of wordlines and bitlines, and each NAND string may include any number of memory cells.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a three-dimensional vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to at least some example embodiments of the inventive concepts is described based on a NAND flash memory device, the nonvolatile memory device according to at least some example embodiments of the inventive concepts may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

FIG. 5 is a plan view of an example of a cell region included in a memory cell array of FIGS. 3 and 4.

Referring to FIG. 5, a cell region CR may include a plurality of channel holes CH.

A channel hole size, for example, a channel hole diameter, may vary according to positions within the cell region CR. For example, portions adjacent to first and second edges EDG1 and EDG2 may have a relatively low peripheral density, and thus channel holes CHa adjacent to the first and second edges EDG1 and EDG2 may have different diameters from those of the other channel holes CH. Channel holes CHb located in a center of the cell region CR may have diameters larger than those of the channel holes CHa adjacent to the first and second edges EDG1 and EDG2. A memory block BLKa may be adjacent to the second edge EDG2, and may be spaced apart from the second edge EDG2 by a first distance d1. A memory block BLKb may not be adjacent to the first and second edges EDG1 and EDG2, may be in the center of the cell region CR, and may be spaced apart from the second edge EDG2 by a second distance d2. The second distance d2 may be greater than the first distance d1. A first diameter of the channel hole CHa included in the memory block BLKa may be smaller than a second diameter of the channel hole CHb included in the memory block BLKb.

Figure 6A:
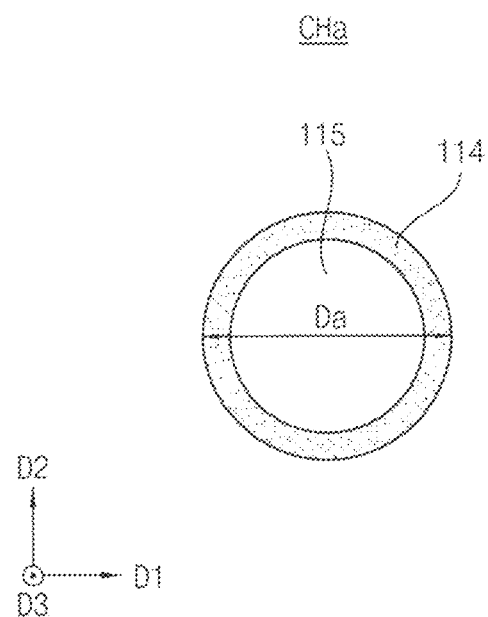
FIGS. 6A, 6B and 6C are diagrams for describing a channel hole formed in a cell region of FIG. 5.
Figure 6B:
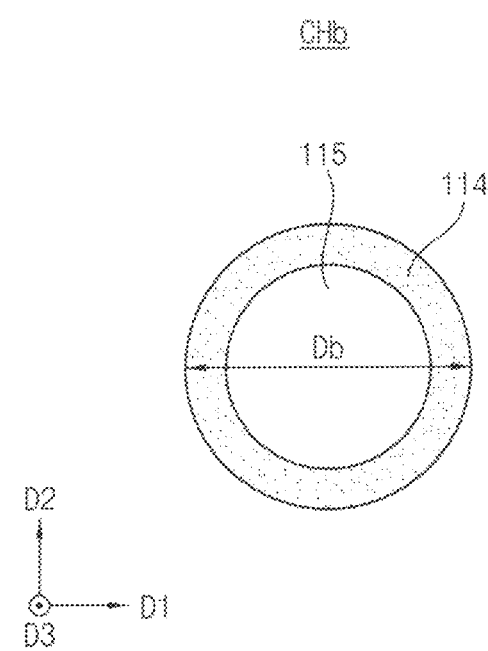
Figure 6C:
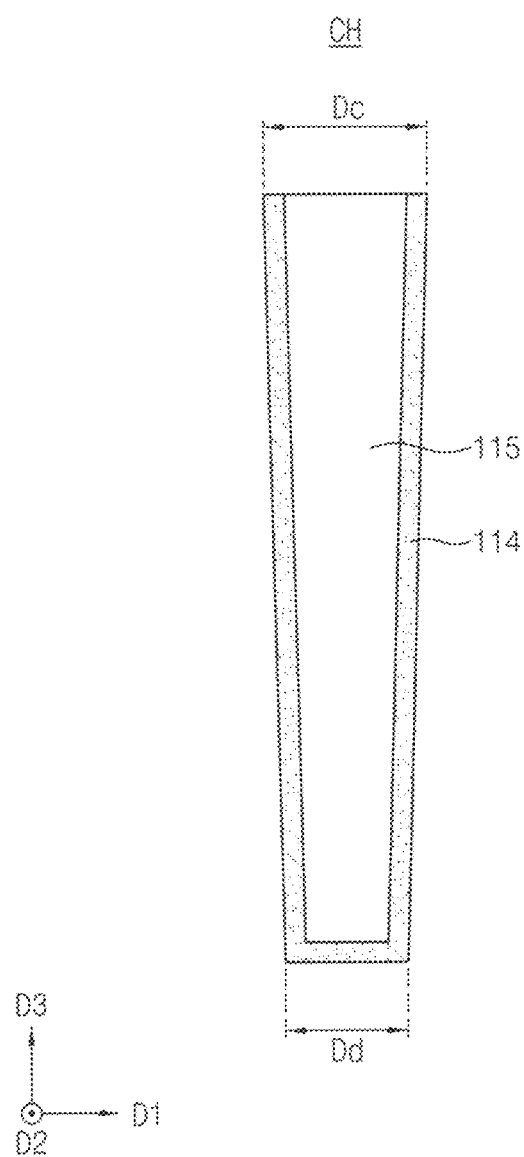

FIGS. 6A, 6B and 6C are diagrams for describing a channel hole formed in a cell region of FIG. 5. FIGS. 6A and 6B are plan views of examples of the channel hole. FIG. 6C is a cross-sectional view of an example of the channel hole.

Referring to FIGS. 6A and 6B, a pillar including a channel layer 114 and an internal layer 115 may be formed in the first channel hole CHa included in the memory block BLKa and the second channel hole CHb included in the memory block BLKb. A first diameter Da of the first channel hole CHa may be smaller than a second diameter Db of the second channel hole CHb.

Referring to FIG. 6C, the pillar including the channel layer 114 and the internal layer 115 may be formed in each channel hole CH. For example, the channel hole CH may be drilled from the top to the bottom, and a diameter Dc on a position where the formation of the channel hole CH starts (e.g., on the top) may be larger than a diameter Dd on a position where the formation of the channel hole CH ends (e.g., on the bottom).

As described above, the diameter of the channel hole may vary depending on the position in the cell area CR, and the diameter of the channel hole may also vary depending on the third direction D3 even within one channel hole. Due to the difference in the channel hole diameter (e.g., size), a difference in characteristic (or reliability) of the memory cells may occur. For example, as the diameter of the channel hole increases, the amount of reliability degradation may decrease or it may be robust against reliability degradation (e.g., the larger the diameter of the channel hole, the less the amount of reliability degradation or the more robust or resistant against reliability degradation the memory cells may be). For example, as the diameter of the channel hole decreases, the amount of reliability degradation may increase or it may be vulnerable to reliability degradation (e.g., the less the diameter of the channel hole, the larger the amount of reliability degradation or the more vulnerable to reliability degradation).

FIG. 7 is a flowchart illustrating an example of a method of reducing reliability degradation of a nonvolatile memory device of FIG. 1. FIGS. 8A, 8B, 8C, 9A, 9B, 9C, 10A and 10B are diagrams for describing an operation of FIG. 7.

Referring to FIGS. 1, 7, 8A, 8B and 8C, the nonvolatile memory device in which the initial data having the initial threshold voltage distribution is stored in the plurality of memory cells connected to the plurality of wordlines may be provided (step S100). Step S100 in FIG. 7 may be substantially the same as step S100 in FIG. 1.

Figure 8A:
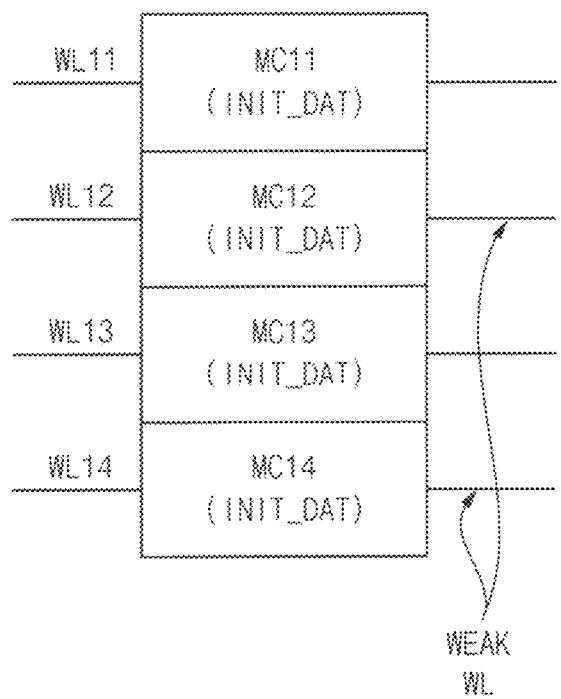

For example, as illustrated in FIG. 8A, initial data INIT_DAT may be stored in a plurality of memory cells MC11, MC12, MC13 and MC14 that are connected to a plurality of wordlines WL11, WL12, WL13 and WL14, respectively, and a nonvolatile memory device that includes the plurality of memory cells MC11 to MC14 storing the initial data INIT_DAT may be provided. For example, the wordlines WL12 and WL14 and the memory cells MC12 and MC14 connected thereto may be vulnerable to reliability degradation, and the wordlines WL11 and WL13 and the memory cells MC11 and MC13 connected thereto may be robust against reliability degradation (e.g., resistant to reliability degradation). For example, memory cells connected to one wordline may form one page. For example, the wordlines WL11 to WL14 and the memory cells MC11 to MC14 may form one memory block. For convenience of illustration, four wordlines and memory cells connected thereto are illustrated, however, example embodiments are not limited thereto.

In step S200, the initial data that is stored in the plurality of memory cells connected to the plurality of wordlines may be erased (step S210), and the first data having the first threshold voltage distribution may be stored into the plurality of memory cells connected to the plurality of wordlines (step S220).

Figure 8B:
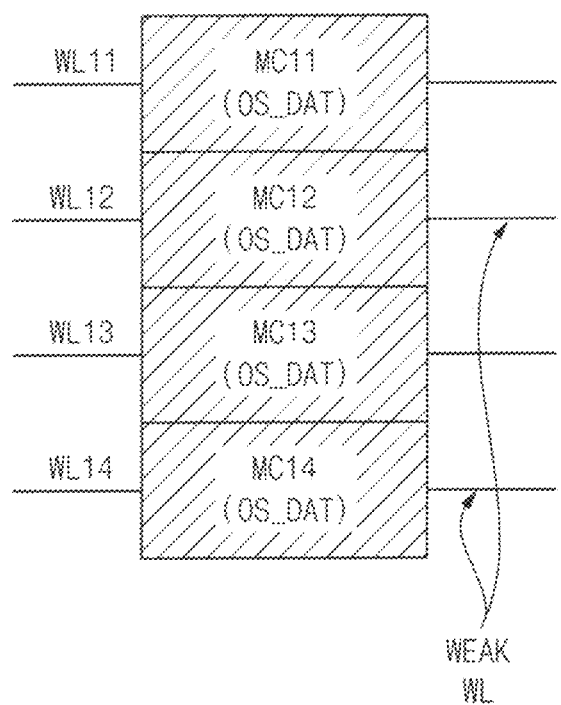

For example, as illustrated in FIG. 8B, the initial data INIT_DAT stored in the plurality of memory cells MC11 to MC14 may be erased, and first data OS_DAT may be stored into the plurality of memory cells MC 11 to MC14. In other words, the first data OS_DAT may be stored into all of the memory cells MC11 to MC14 connected to all of the wordlines WL11 to WL14 in one memory block.

In step S300, the first data that is stored in the plurality of memory cells connected to the plurality of wordlines may be erased (step S310), and the second data having the second threshold voltage distribution may be stored into the plurality of memory cells connected to the plurality of wordlines (step S320).

Figure 8C:
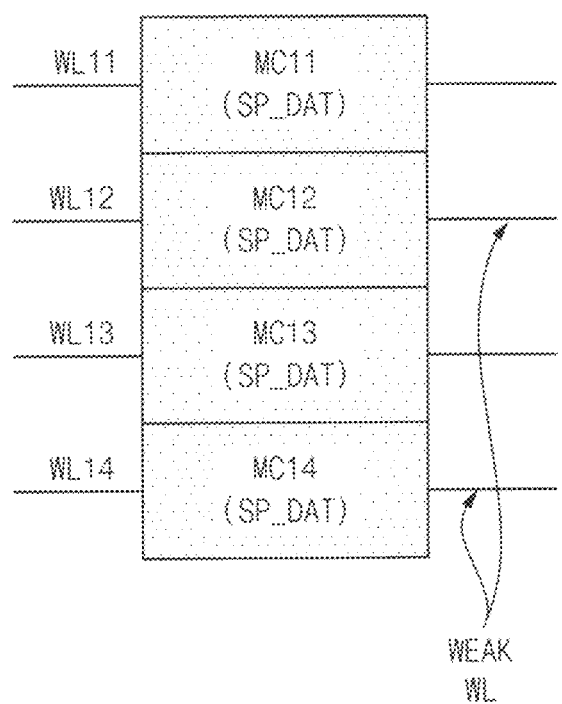

For example, as illustrated in FIG. 8C, the first data OS_DAT stored in the plurality of memory cells MC11 to MC14 may be erased, and second data SP_DAT may be stored into the plurality of memory cells MC 11 to MC14. In other words, the second data SP_DAT may be stored into all of the memory cells MC11 to MC14 connected to all of the wordlines WL11 to WL14 in one memory block.

In some example embodiments, the erase operation in step S310 and the storage operation (or program operation) in step S320 may be performed at once, at a time or simultaneously. For example, the erase operation in step S310 and the storage operation in step S320 may be performed during one busy period.

In some example embodiments, the first write operation in step S200 and the second write operation in step S300 may be sequentially performed. For example, at least one test operation using the first data OS_DAT stored in the nonvolatile memory device may be performed between step S200 and step S300 (e.g., between step S220 and step S310).

In some example embodiments, the first process may be performed immediately after step S300 is completed (e.g., immediately after step S320 is performed). In addition, at least one test operation may be further performed after the first process is performed.

In some example embodiments, a performer who performing steps S310 and S320 may be the customer. For example, the second data SP_DAT having the second threshold voltage distribution may be provided to the customer, and the customer may perform steps S310 and S320 using the second data SP_DAT.

Figure 9A:
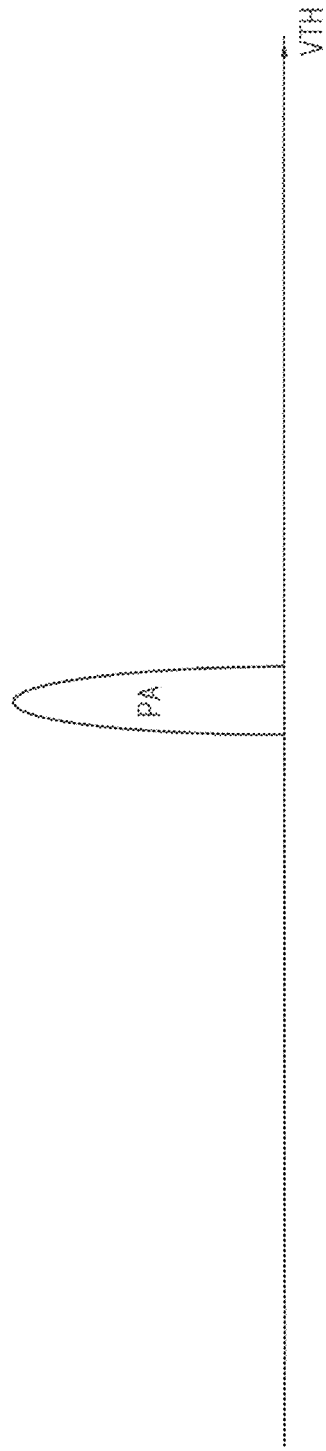
Figure 9B:
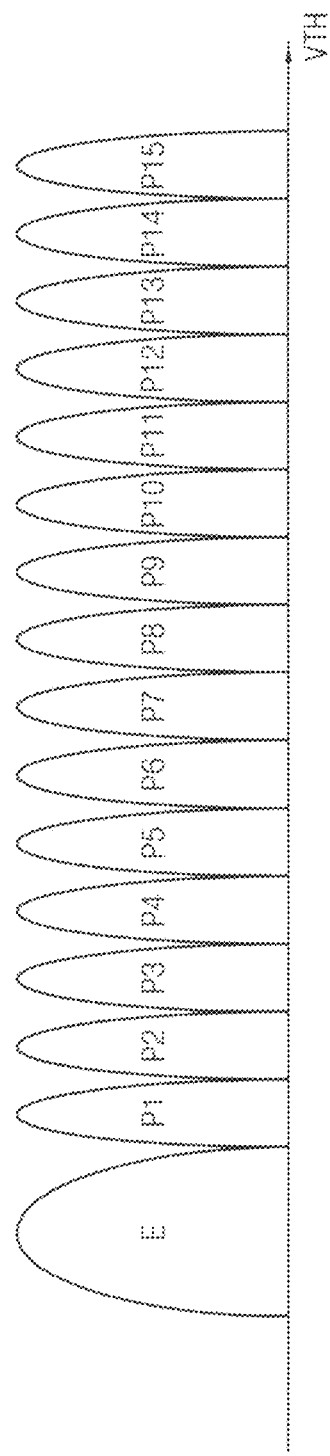
Figure 9C:
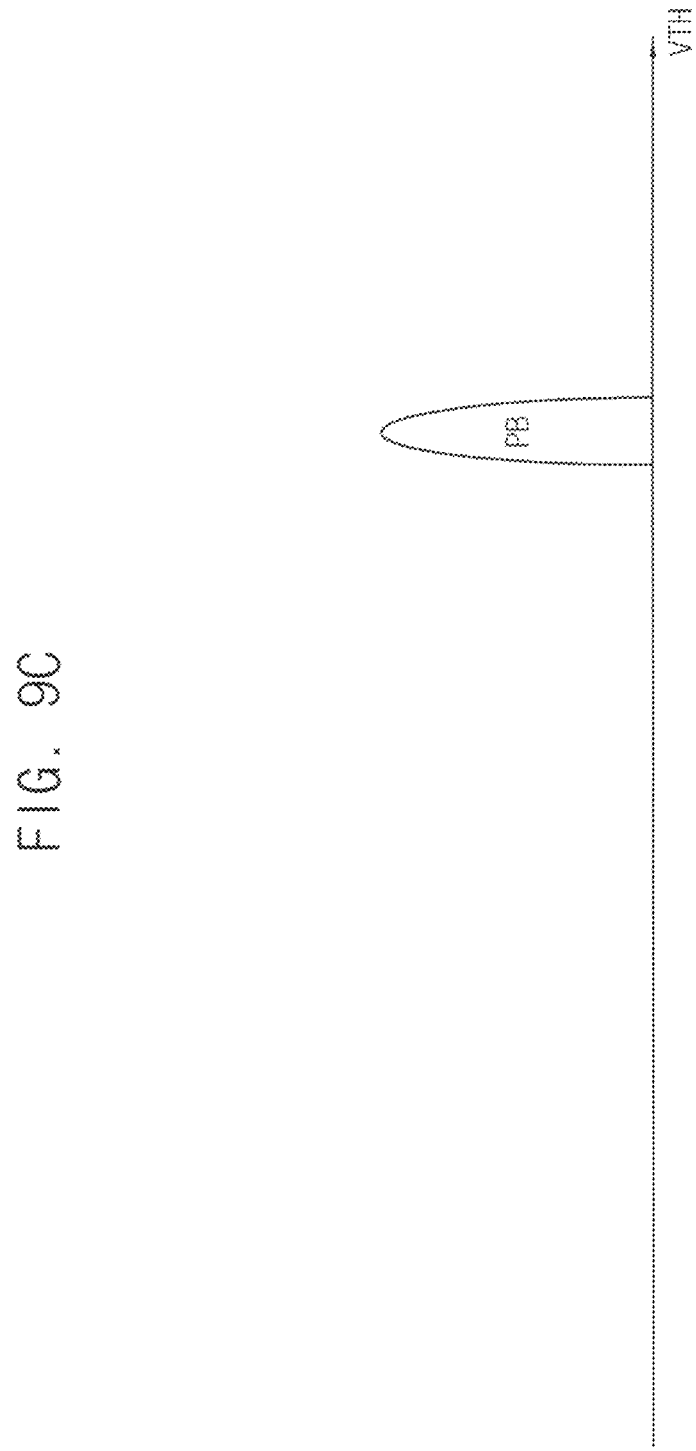

Referring to FIGS. 9A, 9B and 9C, examples of the initial threshold voltage distribution of the initial data INIT_DAT in FIG. 8A, the first threshold voltage distribution of the first data OS_DAT in FIG. 8B, and the second threshold voltage distribution of the second data SP_DAT in FIG. 8C are illustrated. FIG. 9A illustrates the initial threshold voltage distribution, FIG. 9B illustrates the first threshold voltage distribution, and FIG. 9C illustrates the second threshold voltage distribution.

As illustrated in FIG. 9B, the first threshold voltage distribution may include a plurality of states E, P1, P2, P3, P4, P5, P6, P7, P8, P9, P10, P11, P12, P13, P14 and P15. For example, the state E may represent an erase state, and the states P1 to P15 may represent a plurality of program states. Although FIG. 9B illustrates an example where the memory cells are quadruple-level cells (QLCs), example embodiments are not limited thereto, and the memory cells may be one of various types of memory cells such as triple-level cells (TLCs), or the like.

As illustrated in FIG. 9A, the initial threshold voltage distribution may include a first state PA. As illustrated in FIG. 9C, the second threshold voltage distribution includes a second state PB. Each of the first state PA and the second state PB may correspond to one of the plurality of states E and P1 to P15 in FIG. 9B. In other words, each of the initial threshold voltage distribution and the second threshold voltage distribution may include only one state.

The amount of reliability degradation may be relatively large on memory cells that store the first data OS_DAT having the first threshold voltage distribution including the plurality of states E and P1 to P15. In contrast, the amount of reliability degradation may be relatively small on memory cells that store the second data SP_DAT having the second threshold voltage distribution including one state PB. Thus, when the second data SP_DAT having the second threshold voltage distribution is stored before the first process is performed, a desired or, alternatively, predetermined reliability criterion may be satisfied even after the first process is performed.

In some example embodiments, when the second data SP_DAT is stored in the plurality of memory cells MC11 to MC14 as illustrated in FIG. 8C, all memory cells or all pages included in the memory block may be programmed at once to have the second threshold voltage distribution of FIG. 9C.

In some example embodiments, the first state PA included in the initial threshold voltage distribution of FIG. 9A and the second state PB included in the second threshold voltage distribution of FIG. 9C may be different from each other. In other example embodiments, the first state PA included in the initial threshold voltage distribution of FIG. 9A and the second state PB included in the second threshold voltage distribution of FIG. 9C may be substantially the same as each other. For example, the second state PB may correspond to the state P11 in FIG. 9B. However, example embodiments are not limited thereto, and the second state PB may be determined depending on configurations and characteristics of the nonvolatile memory device and the memory cells and may be determined to be suitable or appropriate for each product depending on experimental examples.

Referring to FIGS. 10A and 10B, examples of an arrangement of the first wordlines (e.g., wordlines robust or resistant against reliability degradation) in step S200 and the second wordlines (e.g., wordlines vulnerable to reliability degradation) in step S300 are illustrated. FIGS. 10A and 10B illustrate an arrangement of the wordlines included in one memory block.

In some example embodiments, in a plan view as illustrated in FIG. 10A, second wordlines WWL and memory cells WMC connected thereto may be disposed or located at an edge of a memory block, and first wordlines SWL and memory cells SMC connected thereto may be disposed or located in a center of the memory block. As described with reference to FIGS. 5, 6A and 6B, the diameter of the channel hole adjacent to the edge of the cell region CR may be relatively small, and the amount of reliability degradation may increase or it may be vulnerable to reliability degradation as the diameter of the channel hole decreases. Therefore, the wordlines positioned at the edge of the memory block may be defined as the second wordlines WWL. In other words, the second wordlines WWL may be disposed closer to the edge of the memory block (or memory cell array) than the first wordlines SWL. According to at least some example embodiments, the second wordlines WWL and memory cells WMC may also be referred to in the present specification as weak wordlines WWL and weak memory cells WMC, and the first wordlines SWL and memory cells SMC may also be referred to in the present specification as strong wordlines SWL and strong memory cells SMC.

In some example embodiments, in a cross-sectional view as illustrated in FIG. 10B, second wordlines WWL and memory cells WMC connected thereto may be disposed or located at a lower portion of a memory block, and first wordlines SWL and memory cells SMC connected thereto may be disposed or located at middle and upper portions of the memory block (e.g., disposed or located above the second wordlines WWL). As described with reference to FIGS. 5 and 6C, the diameter of the bottom of the channel hole may be relatively small when the channel hole starts to be drilled from the top, and the amount of reliability degradation may increase or it may be vulnerable to reliability degradation as the diameter of the channel hole decreases. Therefore, the wordlines positioned at the lower portion of the memory block may be defined as the second wordlines WWL. In other words, the second wordlines WWL may be disposed closer to the lower portion of the memory block (or memory cell array) than the first wordlines SWL. Although not illustrated in detail, a substrate (e.g., the substrate 111 in FIG. 3) may be disposed under the second wordlines WWL.

Although only the outermost and lowermost wordlines are defined as the second wordlines WWL in FIGS. 10A and 10B, example embodiments are not limited thereto, and the number of second wordlines WWL in the memory block may be changed according to at least some example embodiments of the inventive concepts.

Figure 11:
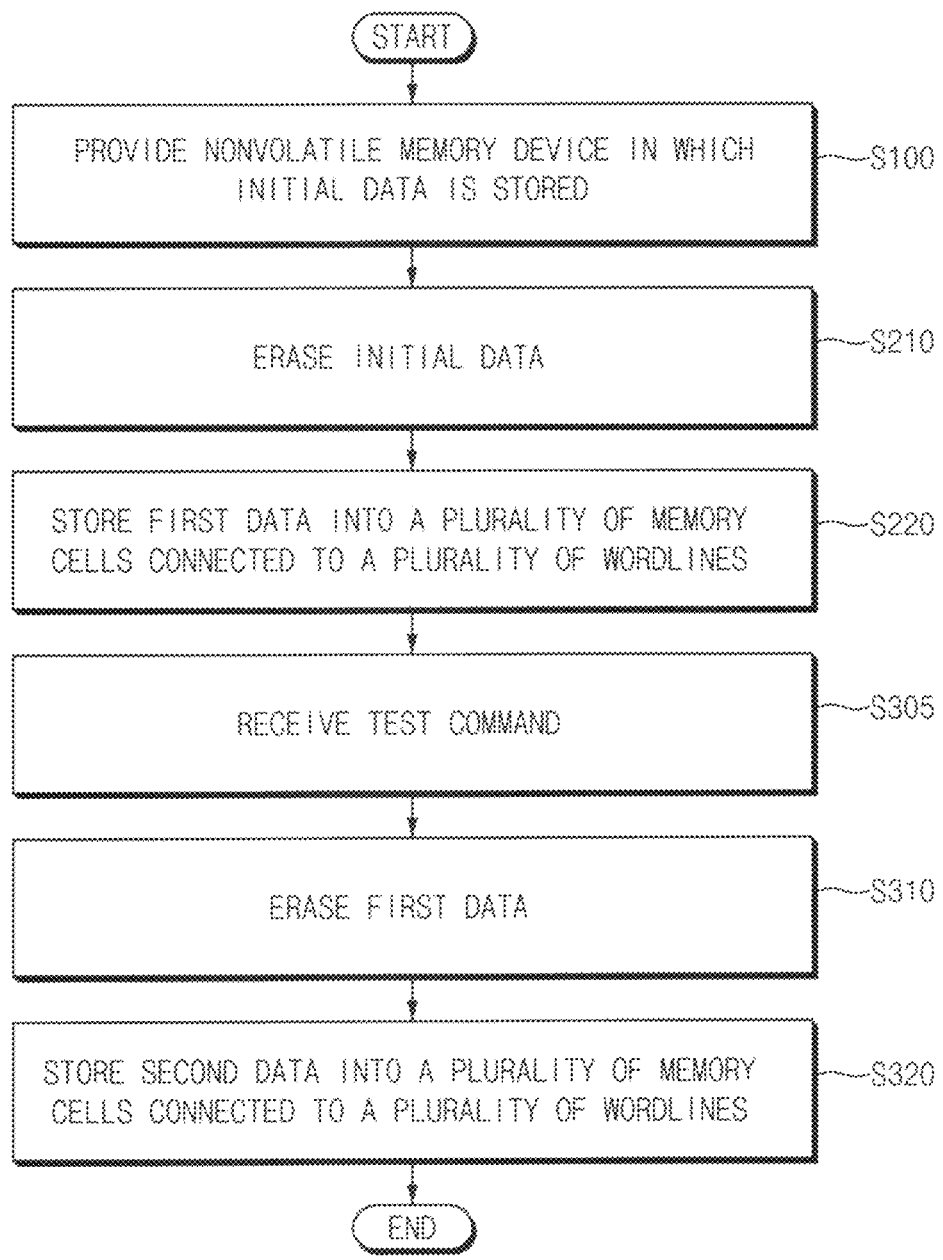

FIGS. 11 and 12 are flowcharts illustrating other examples of a method of reducing reliability degradation of a nonvolatile memory device of FIG. 1. The descriptions repeated with FIG. 7 will be omitted.

Referring to FIGS. 1 and 11, steps S100, S210 and S220 may be substantially the same as steps S100, S210 and S220 in FIG. 7, respectively.

In step S300, a test command may be received (step S305), and steps S310 and S320 may be performed based on the test command. Steps S310 and S320 may be substantially the same as steps S310 and S320 in FIG. 7, respectively.

In some example embodiments, the erase operation in step S310 and the storage operation (or program operation) in step S320 may be performed at once based on the test command.

In some example embodiments, the test command may be implemented and provided by a manufacturer of the nonvolatile memory device. The customer may perform steps S310 and S320 using the test command provided by the manufacturer.

Referring to FIGS. 1 and 12, steps S100, S210, S220, S310 and S320 may be substantially the same as steps S100, S210, S220, S310 and S320 in FIG. 7, respectively.

After step S300 is performed, and after the first process is performed on the nonvolatile memory device, a third write operation may be performed such that the first data having the first threshold voltage distribution is stored into the memory cells connected to the first wordlines. For example, the second data that is stored in the plurality of memory cells connected to the plurality of wordlines may be erased (step S410), and the first data having the first threshold voltage distribution may be stored into the plurality of memory cells connected to the plurality of wordlines (step S420). For example, the first data OS_DAT may be stored as illustrated in FIG. 8B.

Since the second data SP_DAT is stored in all of the memory cells MC11 to MC14 connected to all of the wordlines WL11 to WL14 in steps S310 and S320, the first data OS_DAT used to drive the nonvolatile memory device and the system for at least one test operation may not exist after the first process is performed. Thus, the first data OS_DAT may be stored again by steps S410 and S420, and the at least one test operation using the first data OS_DAT may be performed thereafter.

Figure 14A:
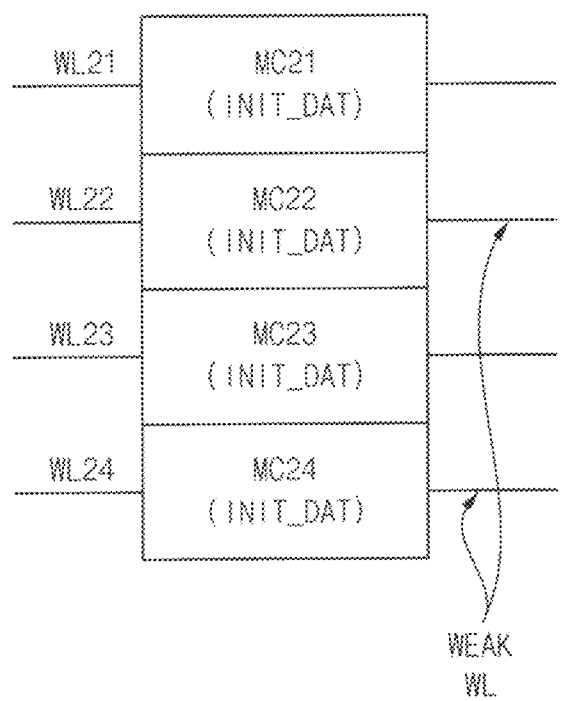
FIGS. 14A and 14B are diagrams for describing an operation of FIG. 13.
Figure 14B:
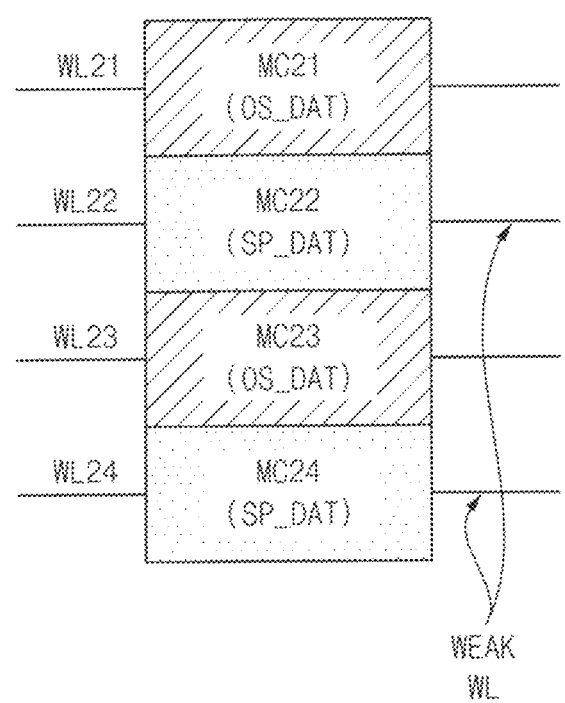

FIG. 13 is a flowchart illustrating an example of a method of reducing reliability degradation of a nonvolatile memory device of FIG. 1. FIGS. 14A and 14B are diagrams for describing an operation of FIG. 13. The descriptions repeated with FIGS. 7, 8A, 8B and 8C will be omitted.

Referring to FIGS. 1, 13, 14A and 14B, step S100 may be substantially the same as step S100 in FIGS. 1 and 7.

For example, as illustrated in FIG. 14A, initial data INIT_DAT may be stored in a plurality of memory cells MC21, MC22, MC23 and MC24 that are connected to a plurality of wordlines WL21, WL22, WL23 and WL24, respectively, and a nonvolatile memory device that includes the plurality of memory cells MC21 to MC24 storing the initial data INIT_DAT may be provided. For example, the wordlines WL22 and WL24 and the memory cells MC22 and MC24 connected thereto may be vulnerable to reliability degradation, and the wordlines WL21 and WL23 and the memory cells MC21 and MC23 connected thereto may be robust or resistant against reliability degradation.

In step S200, the initial data that is stored in the plurality of memory cells connected to the plurality of wordlines may be erased (step S210), and the first data having the first threshold voltage distribution may be stored into first memory cells connected to the first wordlines among the plurality of memory cells (step S230). In step S300, the second data having the second threshold voltage distribution may be stored into second memory cells connected to the second wordlines among the plurality of memory cells (step S330).

For example, as illustrated in FIG. 14B, the initial data INIT_DAT stored in the plurality of memory cells MC21 to MC24 may be erased, the first data OS_DAT may be stored into the memory cells MC21 and MC23, and the second data SP_DAT may be stored into the memory cells MC22 and MC24. In other words, the first data OS_DAT may be stored only into the memory cells MC21 and MC23 connected to the wordlines WL21 and WL23 that are robust or resistant against reliability degradation, and the second data SP_DAT may be stored only into the memory cells MC22 and MC24 connected to the wordlines WL22 and WL24 that are vulnerable to reliability degradation.

In some example embodiments, the first write operation in step S200 and the second write operation in step S300 may be substantially simultaneously performed. For example, steps S230 and S330 may be substantially simultaneously performed.

In some example embodiments, a performer who performing step S330 may be the customer. For example, an address (e.g., the address 162 in FIG. 2) of the wordlines WL22 and WL24 and the memory cells MC22 and MC24 and the second data SP_DAT having the second threshold voltage distribution may be provided to the customer, and the customer may perform step S330 using the address 162 and the second data SP_DAT.

In the example of FIG. 13, at least one test operation may be performed using the first data OS_DAT stored in the memory cells MC21 and MC23, and thus the third write operation described with reference to FIG. 12 may not be necessary.

Figure 16A:
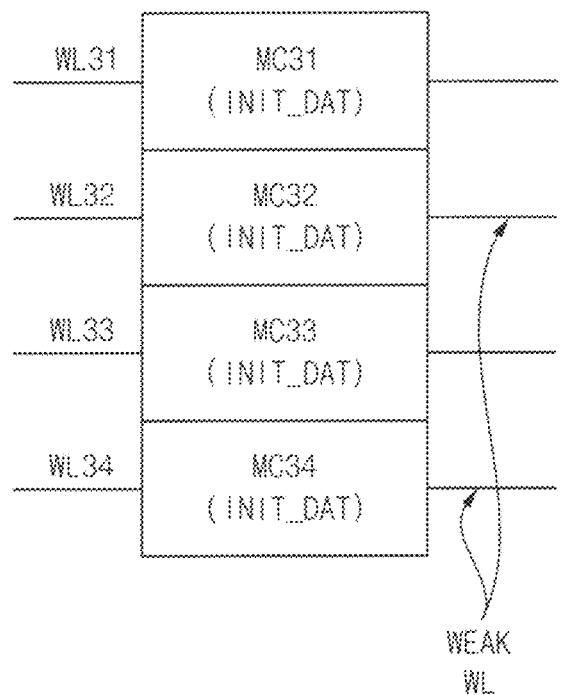
Figure 16B:
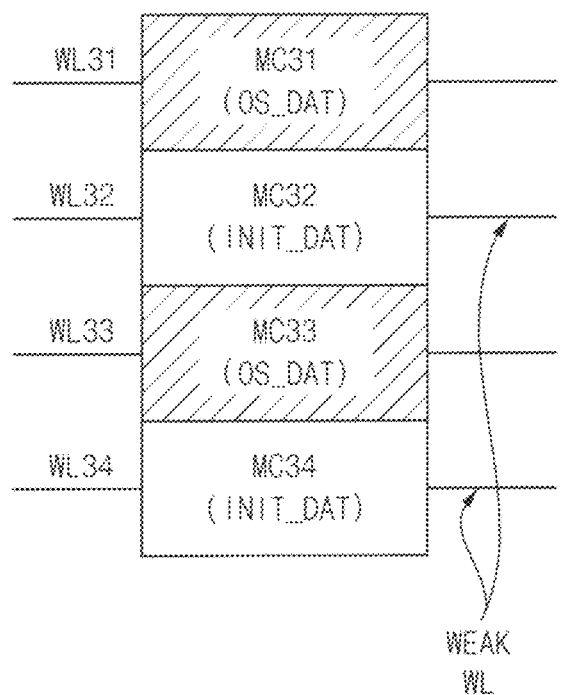

FIG. 15 is a flowchart illustrating an example of a method of reducing reliability degradation of a nonvolatile memory device of FIG. 1. FIGS. 16A, 16B and 16C are diagrams for describing an operation of FIG. 15. The descriptions repeated with FIGS. 7, 8A, 8B, 8C, 13, 14A and 14B will be omitted.

Referring to FIGS. 1, 15, 16A, 16B and 16C, step S100 may be substantially the same as step S100 in FIGS. 1 and 13.

For example, as illustrated in FIG. 16A, initial data INIT_DAT may be stored in a plurality of memory cells MC31, MC32, MC33 and MC34 that are connected to a plurality of wordlines WL31, WL32, WL33 and WL34, respectively, and a nonvolatile memory device that includes the plurality of memory cells MC31 to MC34 storing the initial data INIT_DAT may be provided. For example, the wordlines WL32 and WL34 and the memory cells MC32 and MC34 connected thereto may be vulnerable to reliability degradation, and the wordlines WL31 and WL33 and the memory cells MC31 and MC33 connected thereto may be robust against reliability degradation (e.g., resistant to reliability degradation).

In step S200, a first test command may be received (step S205), and steps S210 and S230 may be performed based on the first test command. Steps S210 and S230 may be substantially the same as steps S210 and S230 in FIG. 13, respectively. For example, as illustrated in FIG. 16B, the initial data INIT_DAT stored in the plurality of memory cells MC31 to MC34 may be erased, and the first data OS_DAT may be stored into the memory cells MC31 and MC33.

In step S300, a second test command different from the first test command may be received (step S307), and step S330 may be performed based on the second test command. Step S330 may be substantially the same as step S330 in FIG. 13. For example, as illustrated in FIG. 16C, the second data SP_DAT may be stored into the memory cells MC32 and MC34.

In some example embodiments, as with that described with reference to FIG. 7, the first write operation in step S200 and the second write operation in step S300 may be sequentially performed. In other example embodiments, as with that described with reference to FIG. 13, the first write operation in step S200 and the second write operation in step S300 may be substantially simultaneously performed.

In some example embodiments, a performer who performing steps S307 and S330 may be the nonvolatile memory device. For example, the first and second test commands may be implemented and provided by the manufacturer of the nonvolatile memory device. The first and second test commands, rather than the address 162 and the second data SP_DAT, may be provided to the customer, and each of the first and second test commands may be turned on and off. When the first test command is turned on, the use or access of the memory cells MC32 and MC34 may be blocked. When the second test command is turned on, the nonvolatile memory device may automatically store the second data SP_DAT into the memory cells MC32 and MC34.

Figure 17:
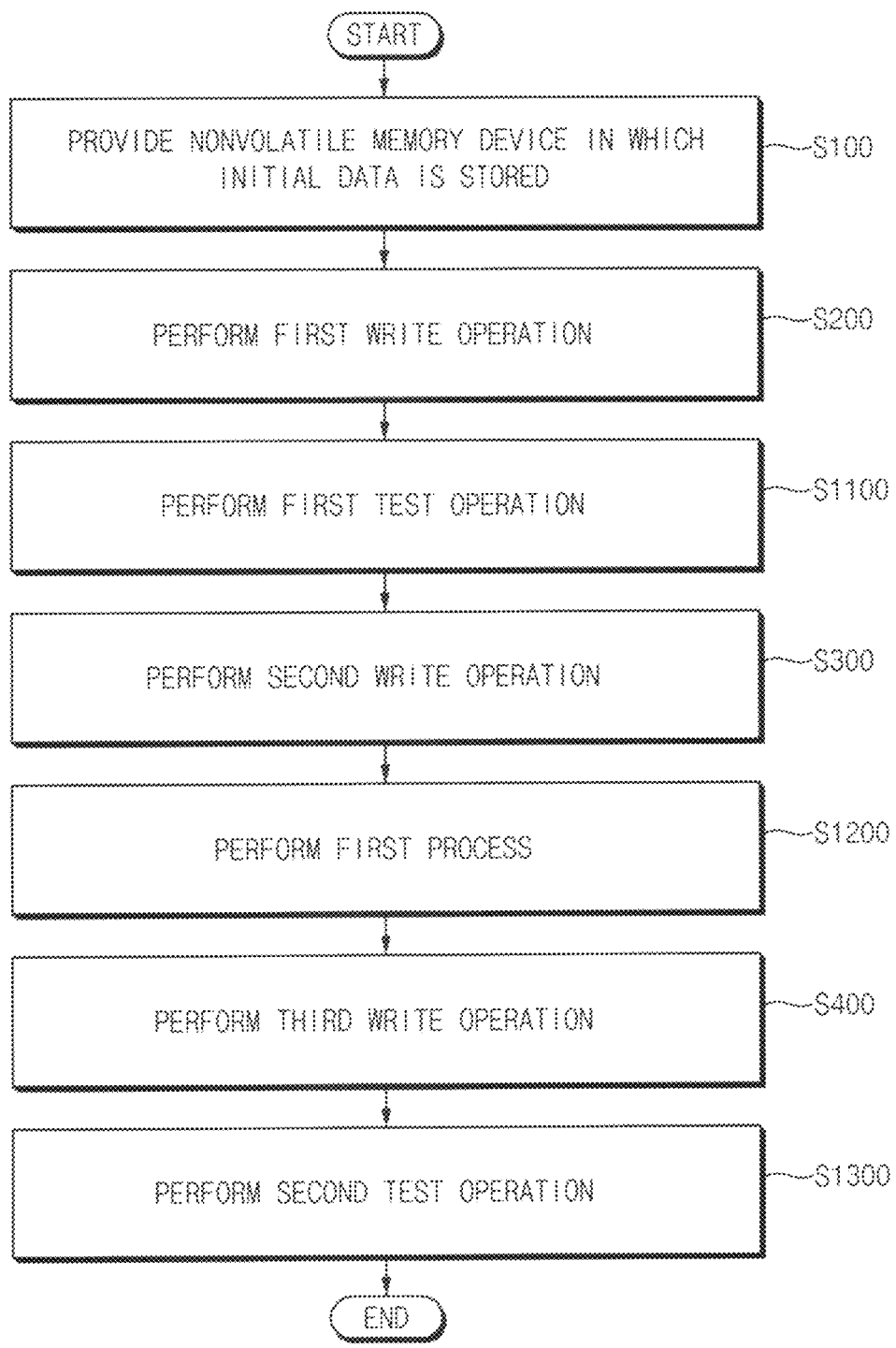
FIGS. 17 and 18 are flowcharts illustrating a method of testing a nonvolatile memory device according to at least some example embodiments of the inventive concepts.
Figure 18:
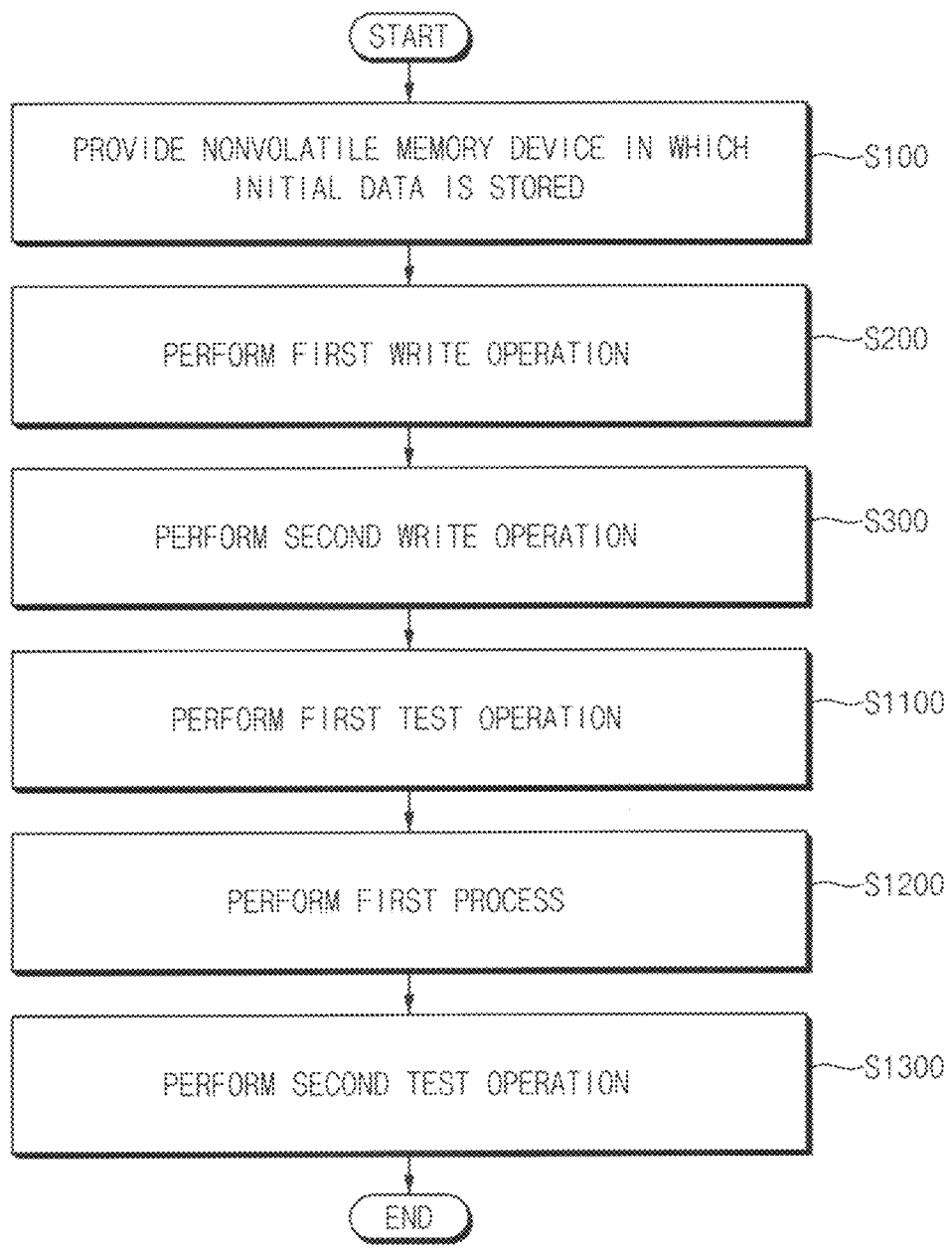

FIGS. 17 and 18 are flowcharts illustrating a method of testing a nonvolatile memory device according to at least some example embodiments of the inventive concepts. The descriptions repeated with FIG. 1 will be omitted.

Referring to FIG. 17, in a method of testing a nonvolatile memory device according to at least some example embodiments of the inventive concepts, steps S100, S200 and S300 may be substantially the same as steps S100, S200 and S300 in FIG. 1, respectively.

A first test operation is performed using the first data stored by step S200 (step S1100). Immediately after step S300, the first process is performed on the nonvolatile memory device (step S1200). Immediately after the first process, a third write operation is performed such that the first data having the first threshold voltage distribution is stored into the memory cells connected to the first wordlines (step S400). A second test operation is performed using the first data stored by step S400 (step S1300).

An example of FIG. 17 may be implemented using the method of reducing reliability degradation described with reference to FIGS. 7 through 12. For example, as described with reference to FIG. 1, when it is desired to perform the test process including various series of test operations and the first process, steps S100 and S200 may be performed before the test process starts. After that, some of the test operations before the first process may be performed, as in step S1100. After that, step S300 may be performed just before the first process. After that, the first process may be performed, as in step S1200. After that, the rest or remainder of the test operations may be performed after the first process, as in steps S400 and S1300.

Referring to FIG. 18, in a method of testing a nonvolatile memory device according to at least some example embodiments of the inventive concepts, steps S100, S200 and S300 may be substantially the same as steps S100, S200 and S300 in FIG. 1, respectively. Step S1200 may be substantially the same as step S1200 in FIG. 17. After that, test operations are performed using the first data stored by step S200 (step S1400).

An example of FIG. 18 may be implemented using the method of reducing reliability degradation described with reference to FIGS. 13 through 16. For example, as described with reference to FIG. 1, when it is desired to perform the test process including various series of test operations and the first process, steps S100, S200 and S300 may be performed before the test process starts. After that, some of the test operations, the first process, and the rest or remainder of the test operations may be sequentially performed, as in steps S1100, S1200 and S1300.

Figure 19:
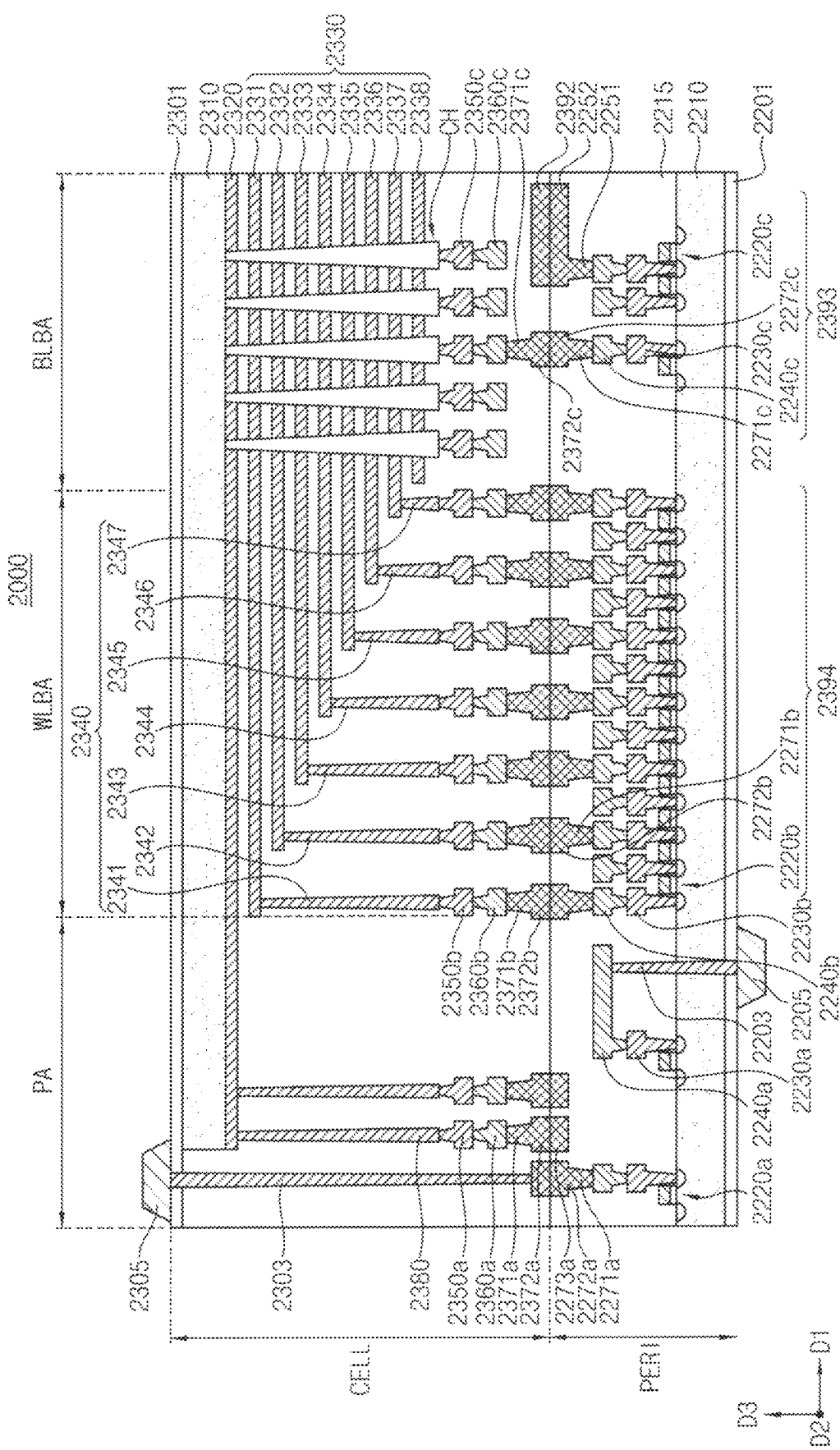
FIG. 19 is a cross-sectional view of a nonvolatile memory device according to at least some example embodiments of the inventive concepts.

FIG. 19 is a cross-sectional view of a nonvolatile memory device according to at least some example embodiments of the inventive concepts.

Referring to FIG. 19, a nonvolatile memory device or a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a wordline bonding area WLBA, and a bitline bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example illustrated in FIG. 19, although only the first metal layers 2230a, 2230b, and 2230c and the second metal layers 2240a, 2240b, and 2240c are shown and described, the example is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230*a*, 2230*b*, and 2230*c*, and the second metal layers 2240*a*, 2240*b*, and 2240*c*. The interlayer insulating layer 2215 may include an insulating material such as silicon oxide, silicon nitride, or the like.

Lower bonding metals 2271*b* and 2272*b* may be formed on the second metal layer 2240*b* in the wordline bonding area WLBA. In the wordline bonding area WLBA, the lower bonding metals 2271*b* and 2272*b* in the peripheral circuit region PERI may be electrically bonded to upper bonding metals 2371*b* and 2372*b* of the cell region CELL. The lower bonding metals 2271*b* and 2272*b* and the upper bonding metals 2371*b* and 2372*b* may be formed of aluminum, copper, tungsten, or the like. Further, the upper bonding metals 2371*b* and 2372*b* in the cell region CELL may be referred as first metal pads and the lower bonding metals 2271*b* and 2272*b* in the peripheral circuit region PERI may be referred as second metal pads.

The cell region CELL may include at least one memory block. The cell region CELL may include a second substrate 2310 and a common source line 2320. On the second substrate 2310, a plurality of wordlines 2331, 2332, 2333, 2334, 2335, 2336, 2337, and 2338 (i.e., 2330) may be stacked in a third direction D3 (e.g., a Z-axis direction), perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH may extend in the third direction D3 (e.g., the Z-axis direction), perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350*c* and a second metal layer 2360*c*. For example, the first metal layer 2350*c* may be a bitline contact, and the second metal layer 2360*c* may be a bitline. In an example embodiment, the bitline 2360*c* may extend in a second direction D2 (e.g., a Y-axis direction), parallel to the upper surface of the second substrate 2310.

In an example illustrated in FIG. 19, an area in which the channel structure CH, the bitline 2360*c*, and the like are disposed may be defined as the bitline bonding area BLBA. In the bitline bonding area BLBA, the bitline 2360*c* may be electrically connected to the circuit elements 2220*c* providing a page buffer 2393 in the peripheral circuit region PERI. The bitline 2360*c* may be connected to upper bonding metals 2371*c* and 2372*c* in the cell region CELL, and the upper bonding metals 2371*c* and 2372*c* may be connected to lower bonding metals 2271*c* and 2272*c* connected to the circuit elements 2220*c* of the page buffer 2393.

In the wordline bonding area WLBA, the plurality of wordlines 2330 may extend in a first direction D1 (e.g., an X-axis direction), parallel to the upper surface of the second substrate 2310 and perpendicular to the second direction D2, and may be connected to a plurality of cell contact plugs 2341, 2342, 2343, 2344, 2345, 2346, and 2347 (i.e., 2340). The plurality of wordlines 2330 and the plurality of cell contact plugs 2340 may be connected to each other in pads provided by at least a portion of the plurality of wordlines 2330 extending in different lengths in the first direction D1. A first metal layer 2350*b* and a second metal layer 2360*b* may be connected to an upper portion of the plurality of cell contact plugs 2340 connected to the plurality of wordlines 2330, sequentially. The plurality of cell contact plugs 2340 may be connected to the peripheral circuit region PERI by the upper bonding metals 2371*b* and 2372*b* of the cell region CELL and the lower bonding metals 2271*b* and 2272*b* of the peripheral circuit region PERI in the wordline bonding area WLBA.

The plurality of cell contact plugs 2340 may be electrically connected to the circuit elements 2220*b* forming a row decoder 2394 in the peripheral circuit region PERI. In an example embodiment, operating voltages of the circuit elements 2220*b* forming the row decoder 2394 may be different than operating voltages of the circuit elements 2220*c* forming the page buffer 2393. For example, operating voltages of the circuit elements 2220*c* forming the page buffer 2393 may be greater than operating voltages of the circuit elements 2220*b* forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350*a* and a second metal layer 2360*a* may be stacked on an upper portion of the common source line contact plug 2380, sequentially. For example, an area in which the common source line contact plug 2380, the first metal layer 2350*a*, and the second metal layer 2360*a* are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220*a*, 2220*b*, and 2220*c* disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220*a*, 2220*b*, and 2220*c* disposed in the peripheral circuit region PERI through a second input/output contact plug 2303. In the example embodiment, the second input/output pad 2305 is electrically connected to a circuit element 2220*a*.

According to embodiments, the second substrate 2310 and the common source line 2320 may not be disposed in an area in which the second input/output contact plug 2303 is disposed. Also, the second input/output pad 2305 may not overlap the wordlines 2330 in the third direction D3 (e.g., the Z-axis direction). The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the wordline bonding area WLBA. In the wordline bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bitline bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The memory device 2000 may be implemented to perform the method of reducing reliability degradation of the nonvolatile memory device and the method of testing the nonvolatile memory device according to at least some example embodiments of the inventive concepts.

Figure 20:
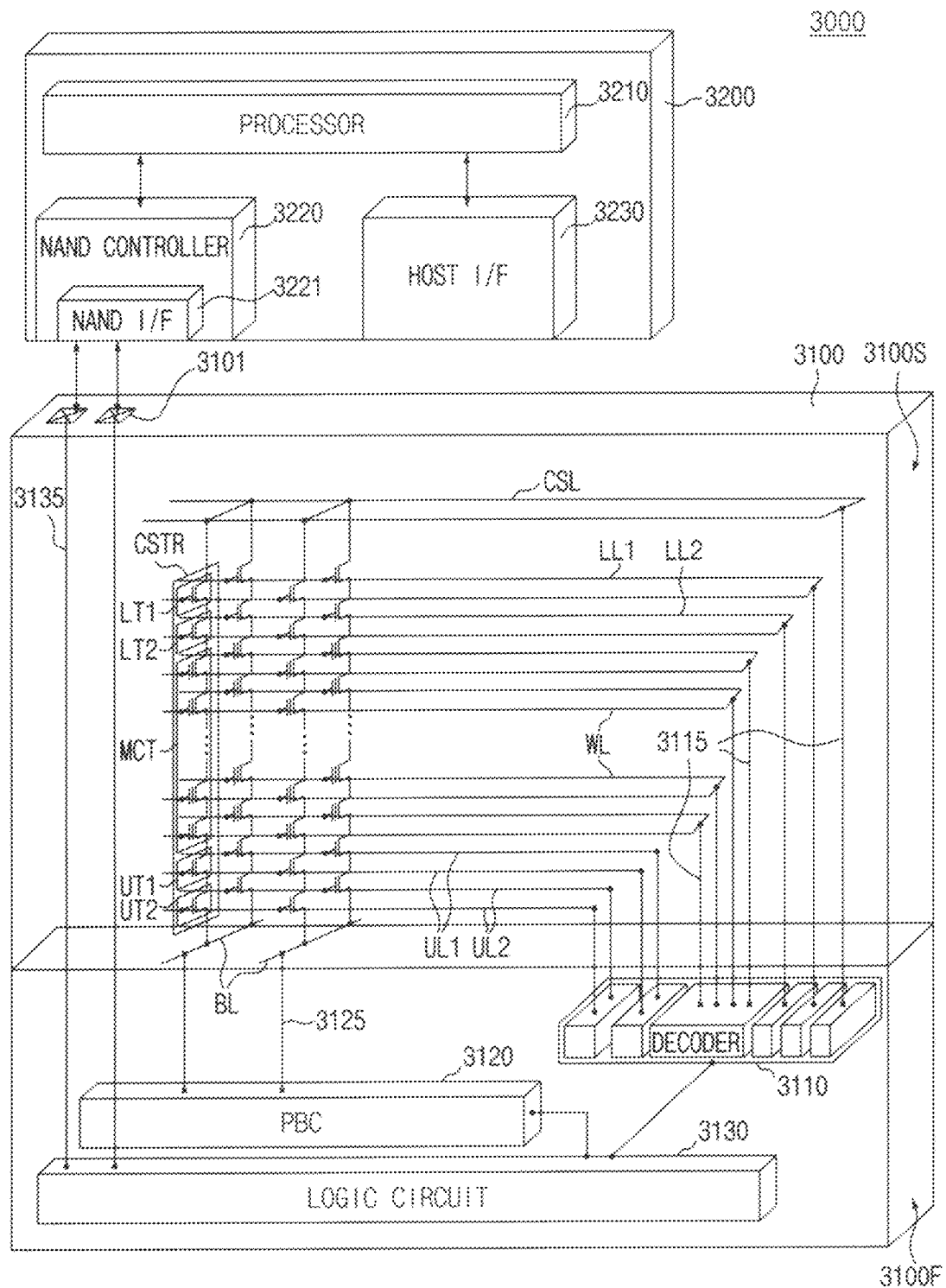
FIG. 20 is a block diagram illustrating an electronic system including a nonvolatile memory device according to at least some example embodiments of the inventive concepts.

FIG. 20 is a block diagram illustrating an electronic system including a nonvolatile memory device according to at least some example embodiments of the inventive concepts.

Referring to FIG. 20, an electronic system 3000 may include a semiconductor device 3100 and a controller 3200 electrically connected to the semiconductor device 3100. The electronic system 3000 may be a storage device including one or a plurality of semiconductor devices 3100 or an electronic device including the storage device. For example, the electronic system 3000 may be a solid-state drive (SSD) device, a universal serial bus (USB), a computing system, a medical device, or a communication device that may include one or a plurality of semiconductor devices 3100.

The semiconductor device 3100 may be a memory device, for example, a nonvolatile memory device according to at least some example embodiments of the inventive concepts described with reference to FIG. 2. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including bitlines BL, a common source line CSL, wordlines WL, first and second upper gate lines UL1 and UL2, first and second lower gate lines LL1 and LL2, and memory cell strings CSTR between the bitlines BL and the common source line CSL.

In the second structure 3100S, each of the memory cell strings CSTR may include lower transistors LT1 and LT2 adjacent to the common source line CSL, upper transistors UT1 and UT2 adjacent to the bitlines BL, and a plurality of memory cell transistors MCT between the lower transistors LT1 and LT2 and the upper transistors UT1 and UT2. The number of the lower transistors LT1 and LT2 and the number of the upper transistors Url and UT2 may be changed according to at least some example embodiments of the inventive concepts.

In some example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The wordlines WL may be gate electrodes of the memory cell transistors MCT, respectively, and the upper gate lines UL1 and UL2 may be gate electrodes of the upper transistors UT1 and UT2, respectively.

In some example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT by gate induced drain leakage (GIDL) phenomenon.

The common source line CSL, the first and second lower gate lines LL1 and LL2, the wordlines WL, and the first and second upper gate lines UL1 and UL2 may be electrically connected to the decoder circuit 3110 through first connection wirings 1115 extending to the second structure 3110S in the first structure 3100F. The bitlines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

Figure 21:
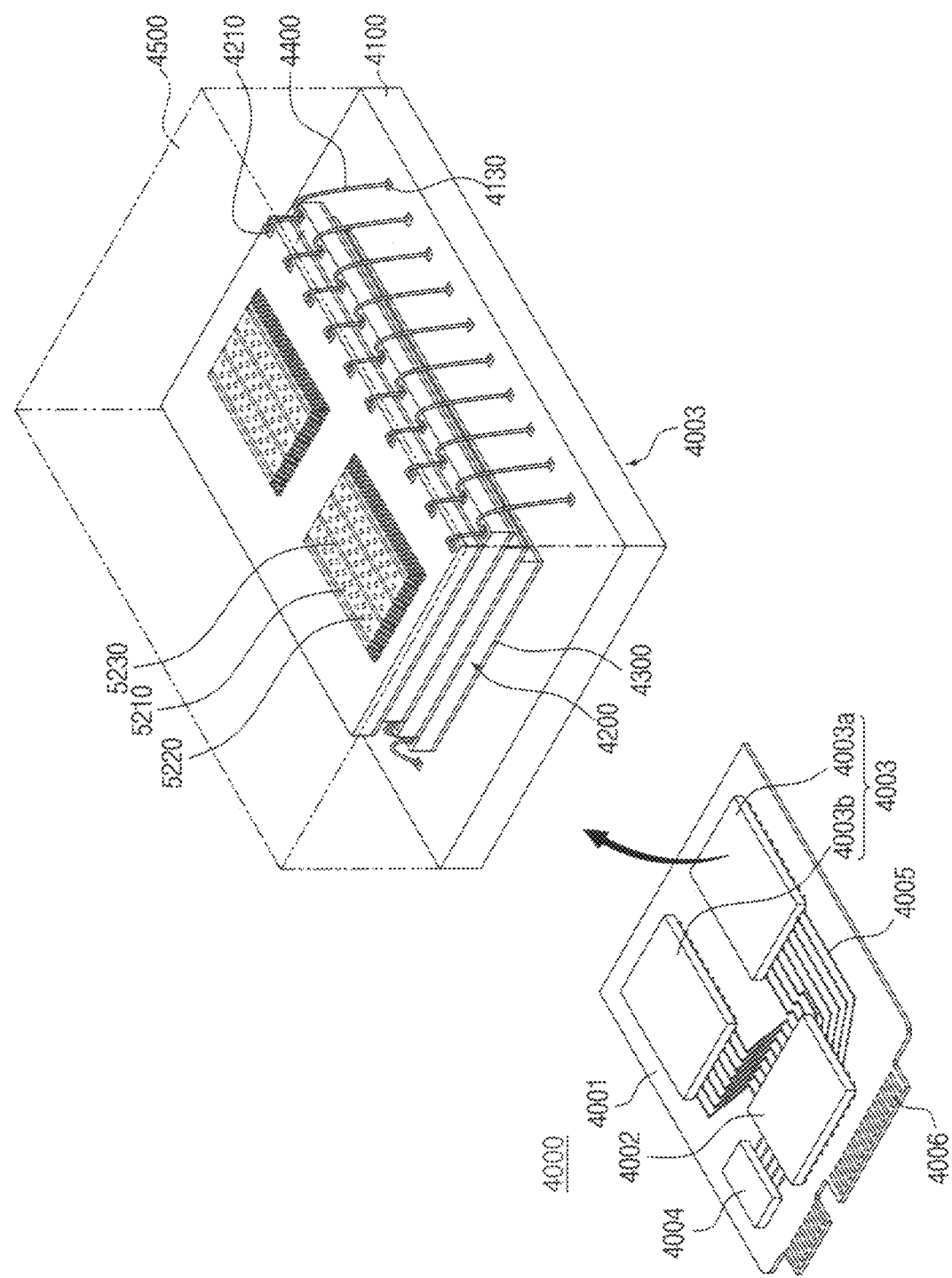
FIG. 21 is a perspective view of an electronic system including a nonvolatile memory device according to at least some example embodiments of the inventive concepts.

FIG. 21 is a perspective view of an electronic system including a nonvolatile memory device according to at least some example embodiments of the inventive concepts.

Referring to FIG. 21, an electronic system 4000 may include a main substrate 4001, a controller 4002 mounted on the main substrate 4001, at least one semiconductor package 4003, and a dynamic random access memory (DRAM) device 4004. The semiconductor package 4003 and the DRAM device 4004 may be connected to the controller 4002 by wiring patterns 4005 on the main substrate 4001.

The main substrate 4001 may include a connector 4006 having a plurality of pins connected to an external host. The number and layout of the plurality pins in the connector 4006 may be changed depending on a communication interface between the electronic system 4000 and the external host. In some example embodiments, the electronic system 4000 may communicate with the external host based on one of a USB, peripheral component interconnect express (PCIe), serial advanced technology attachment (SATA), M-PHY for universal flash storage (UFS), or the like. In some example embodiments, the electronic system 4000 may be driven or may operate by a power source provided from the external host through the connector 4006. The electronic system 4000 may further include a power management integrated circuit (PMIC) for distributing the power source provided from the external host to the controller 4002 and the semiconductor package 4003.

The controller 4002 may write data in the semiconductor package 4003 or read data from the semiconductor package 4003, and may enhance an operation speed of the electronic system 4000.

The DRAM device 4004 may be a buffer memory for reducing the speed difference between the semiconductor package 4003 for storing data and the external host. The DRAM device 4004 included in the electronic system 4000 may serve as a cache memory, and may provide a space for temporarily storing data during the control operation for the semiconductor package 4003. When the electronic system 4000 includes the DRAM device 4004, the controller 4002 may further include a DRAM controller for controlling the DRAM device 4004 in addition to the NAND controller for controlling the semiconductor package 4003.

The semiconductor package 4003 may include first and second semiconductor packages 4003a and 4003b spaced apart from each other. The first and second semiconductor packages 4003a and 4003b may be semiconductor packages each of which includes a plurality of semiconductor chips 4200. Each of the first and second semiconductor packages 4003a and 4003b may include a package substrate 4100, the semiconductor chips 4200, bonding layers 4300 disposed under the semiconductor chips 4200, a connection structure 4400 for electrically connecting the semiconductor chips 4200 with the package substrate 4100, and a mold layer 4500 covering the semiconductor chips 4200 and the connection structure 4400 on the package substrate 4100.

The package substrate 4100 may be a printed circuit board (PCB) including package upper pads 4130. Each semiconductor chip 4200 may include an input/output pad 4210. The input/output pad 4210 may correspond to the input/output pad 3101 in FIG. 20. Each semiconductor chip 4200 may include gate electrode structures 5210, memory channel structures 5220 extending through the gate electrode structures 5210, and division structures 5230 for dividing the gate electrode structures 5210. Each semiconductor chip 4200 may include a nonvolatile memory device according to at least some example embodiments of the inventive concepts described with reference to FIG. 2.

In some example embodiments, the connection structure 4400 may be a bonding wire for electrically connecting the input/output pad 4210 and the package upper pads 4130.

A nonvolatile memory device or a storage device according to at least some example embodiments of the inventive concepts may be packaged using various package types or package configurations.

At least some example embodiments of the inventive concepts may be applied to various electronic devices and systems that include the glitch detectors and the security devices. For example, at least some example embodiments of the inventive concepts may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc. Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A method of reducing reliability degradation of a nonvolatile memory device that includes a plurality of memory cells connected to a plurality of wordlines, the method comprising:
   providing the nonvolatile memory device in which initial data having an initial threshold voltage distribution is stored in the plurality of memory cells connected to the plurality of wordlines;
   before a first process is performed on the nonvolatile memory device, performing a first write operation such that first data having a first threshold voltage distribution is stored into memory cells connected to first wordlines, the first process being a process that causes reliability degradation of the plurality of memory cells, the first threshold voltage distribution being different from the initial threshold voltage distribution, the first wordlines having a degree of reliability degradation less than a reference value among the plurality of wordlines; and before the first process is performed on the nonvolatile memory device, performing a second write operation such that second data having a second threshold voltage distribution is stored into memory cells connected to second wordlines, the second threshold voltage distribution being different from the first threshold voltage distribution, the second wordlines having a degree of reliability degradation greater than or equal to the reference value among the plurality of wordlines.

2. The method of claim 1, wherein:
the first threshold voltage distribution includes a plurality of states,
the initial threshold voltage distribution includes only a first state among the plurality of states, and
the second threshold voltage distribution includes only a second state among the plurality of states.

3. The method of claim 2, wherein the first state and the second state are different from each other.

4. The method of claim 2, wherein the first state and the second state are the same as each other.

5. The method of claim 1, wherein performing the first write operation comprises:
erasing the initial data stored in the plurality of memory cells connected to the plurality of wordlines; and
storing the first data having the first threshold voltage distribution into the plurality of memory cells connected to the plurality of wordlines.

6. The method of claim 5, wherein performing the second write operation comprises:
erasing the first data stored in the plurality of memory cells connected to the plurality of wordlines; and
storing the second data having the second threshold voltage distribution into the plurality of memory cells connected to the plurality of wordlines.

7. The method of claim 6,
wherein performing the second write operation further comprises:
receiving a test command; and
wherein the erasing of the first data and the storing of the second data are performed at once based on the test command.

8. The method of claim 6, wherein the first write operation and the second write operation are sequentially performed.

9. The method of claim 6, further comprising:
after the first process is performed on the nonvolatile memory device,
erasing the second data stored in the plurality of memory cells connected to the plurality of wordlines, and
storing the first data having the first threshold voltage distribution into the plurality of memory cells connected to the plurality of wordlines.

10. The method of claim 1, wherein performing the first write operation comprises:
erasing the initial data stored in the plurality of memory cells connected to the plurality of wordlines; and
storing the first data having the first threshold voltage distribution into first memory cells connected to the first wordlines among the plurality of memory cells.

11. The method of claim 10, wherein performing the second write operation comprises:
storing the second data having the second threshold voltage distribution into second memory cells connected to the second wordlines among the plurality of memory cells.

12. The method of claim 11, wherein the first write operation and the second write operation are simultaneously performed.

13. The method of claim 11, wherein performing the first write operation further comprises:
receiving a first test command; and
wherein the erasing of the initial data and the storing of the first data are performed based on the first test command.

14. The method of claim 13, wherein performing the second write operation further comprises:
receiving a second test command different from the first test command; and
wherein the storing of the second data is performed based on the second test command.

15. The method of claim 1, wherein:
the second wordlines are disposed closer to an edge of a memory cell array than the first wordlines, and
the memory cell array includes the plurality of memory cells and the plurality of wordlines.

16. The method of claim 1, wherein the first process includes a solder reflow process in which thermal stress is applied to the nonvolatile memory device.

17. A nonvolatile memory device comprising:
a memory cell array including a plurality of memory cells connected to a plurality of wordlines; and
a control circuit configured to control an operation of the memory cell array, wherein the control circuit is configured to
provide the nonvolatile memory device in which initial data having an initial threshold voltage distribution is stored in the plurality of memory cells connected to the plurality of wordlines,
before a first process is performed on the nonvolatile memory device, perform a first write operation such that first data having a first threshold voltage distribution is stored into memory cells connected to first wordlines, the first process being a process that causes reliability degradation of the plurality of memory cells, the first threshold voltage distribution being different from the initial threshold voltage distribution, the first wordlines having a degree of reliability degradation less than a reference value among the plurality of wordlines, and
before the first process is performed on the nonvolatile memory device, perform a second write operation such that second data having a second threshold voltage distribution is stored into memory cells connected to second wordlines, the second threshold voltage distribution being different from the first threshold voltage distribution, the second wordlines having a degree of reliability degradation greater than or equal to the reference value among the plurality of wordlines.

18. The nonvolatile memory device of claim 17, wherein,
the memory cell array is a three-dimensional memory cell array in which the plurality of wordlines and the plurality of memory cells are disposed in a vertical direction perpendicular to a substrate, and
the second wordlines include a lowermost wordline closest to the substrate among the plurality of wordlines.

19. The nonvolatile memory device of claim 17, wherein the nonvolatile memory device has a chip-to-chip (C2C) structure in which a first chip including the memory cell array is manufactured, a second chip including the control circuit is manufactured, and the first chip and the second chip are bonded to each other.

20. A method of testing a nonvolatile memory device that includes a plurality of memory cells connected to a plurality of wordlines, the method comprising:

providing the nonvolatile memory device in which initial data is stored in the plurality of memory cells connected to the plurality of wordlines, the initial data having an initial threshold voltage distribution that includes only a first state;

before a solder reflow process is performed on the nonvolatile memory device, performing a first write operation such that first data is stored into memory cells connected to first wordlines from among the plurality of wordlines, the solder reflow process being a manufacturing process in which thermal stress is applied to the nonvolatile memory device, the first data having a first threshold voltage distribution that is different from the initial threshold voltage distribution and includes a plurality of states, the first wordlines having a degree of reliability degradation less than a reference value among the plurality of wordlines;

performing a first test operation on the nonvolatile memory device;

before the solder reflow process is performed on the nonvolatile memory device, performing a second write operation such that second data is stored into memory cells connected to second wordlines from among the plurality of wordlines, the second data having a second threshold voltage distribution that is different from the first threshold voltage distribution and includes only a second state, the second wordlines having a degree of reliability degradation greater than or equal to the reference value among the plurality of wordlines;

performing the solder reflow process on the nonvolatile memory device; and performing a second test operation on the nonvolatile memory device, wherein each of the first state and the second state are included in the plurality of states, wherein the second data is more robust against reliability degradation than the first data, and wherein the first test operation is performed before the second write operation or after the second write operation.

* * * * *